US012813309B2

(12) United States Patent
Song et al.

(10) Patent No.: US 12,813,309 B2
(45) Date of Patent: Nov. 24, 2026

(54) OPTICAL ROUTING STRUCTURE ON BACKSIDE OF SUBSTRATE FOR PHOTONIC DEVICES

(71) Applicant: Taiwan Semiconductor Manufacturing Company, Ltd., Hsin-Chu (TW)

(72) Inventors: Weiwei Song, San Jose, CA (US); Chan-Hong Chern, Palo Alto, CA (US); Feng-Wei Kuo, Zhudong Township (TW); Lan-Chou Cho, Hsinchu City (TW); Stefan Rusu, Sunnyvale, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 506 days.

(21) Appl. No.: 18/358,199

(22) Filed: Jul. 25, 2023

(65) Prior Publication Data

US 2023/0369197 A1 Nov. 16, 2023

Related U.S. Application Data

(60) Continuation of application No. 17/863,624, filed on Jul. 13, 2022, now Pat. No. 11,756,875, which is a (Continued)

(51) Int. Cl.

*H10W 72/00* (2026.01)
*G02B 6/43* (2006.01)

(Continued)

(52) U.S. Cl.

CPC .............. *H10W 72/00* (2026.01); *G02B 6/43* (2013.01); *H10F 71/00* (2025.01); *H10F 77/413* (2025.01)

(58) Field of Classification Search

CPC ........... H01L 23/52; G02B 6/43; G02B 6/132; G02B 6/136; G02B 6/12002; G02B 6/30; G02B 6/34; G02B 6/12004; G02B 6/122; G02B 6/124; G02B 6/13; H10F 71/00; H10F 77/413

See application file for complete search history.

(56) References Cited

U.S. PATENT DOCUMENTS 6,060,732 A 5/2000 Murakami et al.
6,236,786 B1 5/2001 Aoki et al.

(Continued)

OTHER PUBLICATIONS

Wikipedia.org "Interposer." Published on May 4, 2020.

(Continued)

*Primary Examiner* — John Bedtelyon

(74) *Attorney, Agent, or Firm* — Eschweiler & Potashnik, LLC

(57) ABSTRACT

In some embodiments, the present disclosure relates to an integrated chip that includes an insulator layer arranged over a substrate. Further, an upper routing structure is arranged over the insulator layer and is made of a semiconductor material. A lower optical routing structure is arranged below the substrate and is embedded in a lower dielectric structure. The integrated chip further includes an anti-reflective layer that is arranged below the substrate and directly contacts the substrate.

20 Claims, 18 Drawing Sheets

Related U.S. Application Data division of application No. 16/984,297, filed on Aug. 4, 2020, now Pat. No. 11,417,596.

(60) Provisional application No. 62/950,294, filed on Dec. 19, 2019.

(51) Int. Cl.
*H10F 71/00* (2025.01)
*H10F 77/40* (2025.01)

(56) References Cited

U.S. PATENT DOCUMENTS

| | | | | |
|---|---|---|---|---|
| 9,285,554 | B2 * | 3/2016 | Doany .................. | G02B 6/124 |
| 2008/0136955 | A1 | 6/2008 | Kathman et al. | |
| 2011/0076028 | A1 | 3/2011 | Griebenow et al. | |
| 2013/0270426 | A1 | 10/2013 | Yang et al. | |
| 2013/0334636 | A1 | 12/2013 | Wen | |
| 2016/0049528 | A1 | 2/2016 | Cho et al. | |
| 2016/0197111 | A1 | 7/2016 | Coolbaugh et al. | |
| 2018/0090636 | A1 | 3/2018 | Nakayama | |
| 2018/0314003 | A1 | 11/2018 | Coolbaugh et al. | |
| 2021/0043785 | A1 | 2/2021 | Maeda et al. | |
| 2021/0242354 | A1 | 8/2021 | Wang et al. | |

OTHER PUBLICATIONS

Wikipedia.org. “Photonics.” Published on Oct. 6, 2019.
Notice of Allowance dated Apr. 1, 2022 for U.S. Appl. No. 16/984,297.
Notice of Allowance dated May 1, 2023 for U.S. Appl. No. 17/863,624.

* cited by examiner

OPTICAL ROUTING STRUCTURE ON BACKSIDE OF SUBSTRATE FOR PHOTONIC DEVICES

REFERENCE TO RELATED APPLICATIONS

This Application is a Continuation of U.S. application Ser. No. 17/863,624, filed on Jul. 13, 2022, which is a Divisional of U.S. application Ser. No. 16/984,297, filed on Aug. 4, 2020 (now U.S. Pat. No. 11,417,596, issued on Aug. 16, 2022), which claims the benefit of U.S. Provisional Application No. 62/950,294, filed on Dec. 19, 2019. The contents of the above-referenced patent applications are hereby incorporated by reference in their entirety.

BACKGROUND

Optical circuits may comprise multiple photonic functions/devices and optical waveguides. Materials of silicon-based photonic devices are being researched to reduce costs and to improve device reliability and performance. Further, smaller package structures, that utilize less area or smaller heights, are being researched for semiconductor devices, including photonic devices. For example, utilizing the frontside and backside of a substrate is one promising option for forming smaller package structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-6A illustrate cross-sectional views of various embodiments of a light source arranged on a backside of a substrate and exemplary light paths traveling through and between an upper optical routing structure on a frontside of a substrate and a lower optical routing structure on a backside of a substrate.

DETAILED DESCRIPTION

Figure 1:
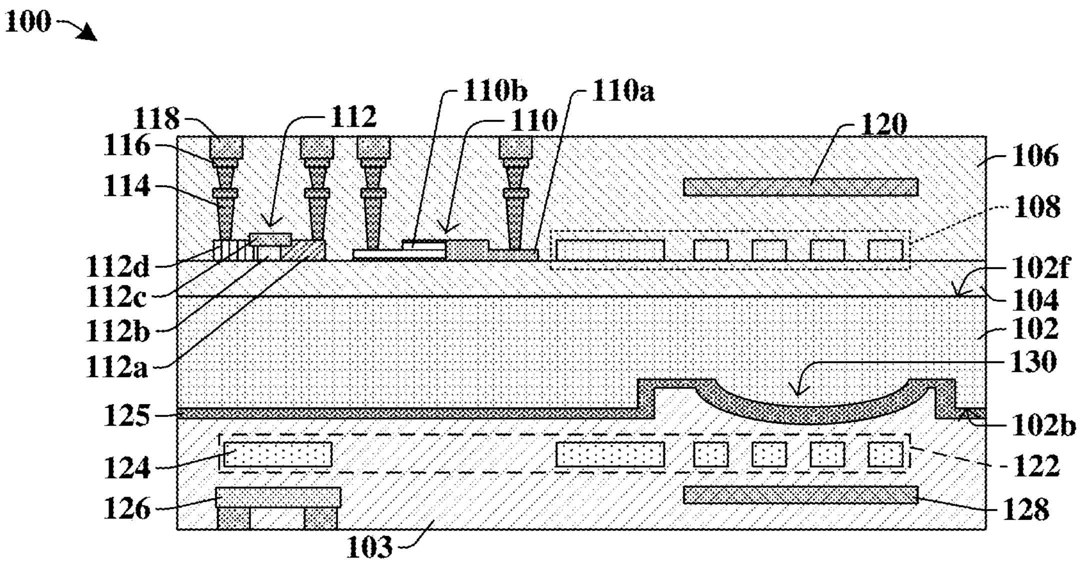
FIG. 1 illustrates a cross-sectional view of some embodiments of an integrated chip having an upper optical routing structure on a frontside of a substrate and a lower optical routing structure on a backside of a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Photonic devices relate to the transmission and/or processing of photons (e.g., light) incident on the photonic device. Materials that may be used in photonic devices at least due to their optical properties include polysilicon, amorphous silicon, aluminum oxide, aluminum nitride, silicon nitride, and some polymeric materials, for example. In some embodiments, silicon nitride may be used in optical routing (e.g., the transmission of light) due to its advantageous optical, thermal, and electrical properties. For example, silicon nitride has a low refractive index compared to silicon dioxide, has a low thermal-optical effect, is compatible with CMOS processes, and can be formed at a relatively high quality at relatively low temperatures (e.g., less than 400 degrees Celsius). However, in some processes, silicon nitride may undergo an annealing process at high temperatures (e.g., greater than about 1000 degrees Celsius) which may negatively impact other features in the photonic circuit that cannot withstand such high temperatures for long periods of time (e.g., up to 48 hours). Thus, the formation of the silicon nitride, or other materials used in photonic devices, may be limited by other features in the photonic circuit.

In some embodiments, a silicon-on-insulator (SOI) substrate may be used in photonic devices, and optical features (e.g., grating, modulators, waveguides, photodiodes, etc.) are formed on a frontside of the SOI substrate. In some embodiments, optical routing features act as an interposer and are configured to receive incident light from a light source, such as, for example an optical fiber and guide the light to a photonic device (e.g., modulator, waveguide, photodiode, etc.). In order to be able to receive incident light, the optical features cannot be fully surrounded by other features of the photonic device such as metal routing for electrical signals. Therefore, the thickness and/or position of the optical features may be limited by other features arranged on the frontside of the SOI substrate, which may result in large, inefficient package structures of photonic devices.

Various embodiments of the present disclosure relate to structures and corresponding methods of forming an integrated chip comprising photonic devices/optical features that are configured to receive photons (e.g., light) on a backside of the SOI substrate. Further, other optical and/or electrical routing features are also arranged on the frontside of the SOI substrate, and thus, anti-reflective layers, reflective minor layers, and/or micro-lenses are present on the frontside and/or backside of the SOI substrate to optimize optical communication between the frontside and backside of the SOI substrate. Further, in some embodiments, some of the optical features on the backside of the SOI substrate may comprise silicon nitride, which may be formed more efficiently on the backside of the SOI substrate without damaging other features on the frontside of the SOI substrate. Thus, by utilizing the backside of the SOI substrate, the positions and structures of the optical features may be optimized to increase device reliability and efficiency and also to reduce package size of the overall photonic device.

FIG. 1 illustrates a cross-sectional view 100 of some embodiments of an integrated chip comprising optical routing structures on a frontside and on a backside of a substrate.

The cross-sectional view 100 of FIG. 1 includes a substrate 102, wherein an upper optical routing structure 108 is arranged on a frontside 102*f* of the substrate 102 and a lower optical routing structure 122 is arranged on a backside 102*b* of the substrate 102. In some embodiments, the substrate 102 may comprise a crystalline structure to allow photons (e.g., light) to travel through the substrate 102 and between the upper and lower optical routing structures 108, 122. In some embodiments, the upper and/or lower optical routing structures 108, 122 may be or comprise a grating structure and/or optical routing guide configured to guide light through the integrated chip.

In some embodiments, 102 a first upper dielectric layer 104 is arranged over the frontside 102*f* of the substrate 102, and the upper optical routing structure 108 may be embedded within a second upper dielectric layer 106. In some embodiments, high-speed photonic devices may be arranged on the frontside 102*f* of the substrate 102. In contrast, in some embodiments, passive routing (e.g., low-speed signals) features are arranged on the backside 102*b* of the substrate 102. For example, in some embodiments, a waveguide 110 may be arranged laterally beside the upper optical routing structure 108 and over the first upper dielectric layer 104. In some embodiments, the waveguide 110 may comprise a first doped portion 110*a* comprising a semiconductor material having a first doping type and a second doped portion 110*b* comprising the semiconductor material having a second doping type. For example, in some embodiments, the first doped portion 110*a* of the waveguide 110 may comprise p-type silicon or germanium, and the second doped portion 110*b* of the waveguide 110 may comprise n-type silicon or germanium. In some embodiments, the waveguide 110 may be part of a modulator that is configured to selectively change the phase, wavelength, frequency, and/or other properties of light that passes through the waveguide 110. Further, in some embodiments, a photodiode 112 may be arranged on a frontside 102*f* of the substrate 102 and also laterally beside the upper optical routing structure 108. In some embodiments, the photodiode 112 may comprise a first outer doped portion 112*a*, a second outer doped portion 112*d*, an upper undoped portion 112*c*, and a lower undoped portion 112*b*. In some embodiments, the photodiode 112 may comprise a semiconductor material such as, for example, silicon or germanium, and the first outer doped portion 112*a* may be p-type and the second outer doped portion 112*d* may be n-type, for example. In some embodiments, the photodiode 112 may be configured to receive light and transmit the light into a digital signal. In some embodiments, the photodiode 112 and the waveguide 110 may be coupled to metal routing for electrical signals that includes interconnect vias 114 and interconnect wires 116. Further, in some embodiments, contact pads 118 may be arranged over the interconnect vias and wires 114, 116 such that the photonic devices (e.g., photodiode 112, waveguide 110) may be coupled to other electronic circuitry. In some embodiments, the integrated chip of FIG. 1 is packaged with another die through, for example, face-to-face packaging at the contact pads 118.

In some embodiments, a heater device 126 may be arranged below the backside 102*b* of the substrate 102. In some embodiments, the heater device 126 may be arranged below a heating portion 124 of the lower optical routing structure 122. In such embodiments, the heater device 126 may be configured to generate and apply heat to the heating portion 124 of the lower optical routing structure 122 to change the refractive index, carrier mobility, and/or other characteristics of light traveling through the lower optical routing structure 122. In some embodiments, the heater device 126 and the lower optical routing structure 122 may be arranged below the backside 102*b* of the substrate 102 and embedded within a lower dielectric structure 103. Because the heater device 126 is arranged on the backside 102*b* of the substrate 102 and away from the photonic devices (e.g., the waveguide 110, the photodiode 112) on the frontside 102*f* of the substrate 102, heat generated from the heater device 126 does not impact the function of the photonic devices (e.g., the waveguide 110, the photodiode 112) and the upper optical routing structure 108 on the frontside 102*f* of the substrate 102.

In some embodiments, the lower optical routing structure 122 may comprise silicon nitride to optimize the efficiency of photon (e.g., light) travel. Silicon nitride has a low refractive index compared to silicon dioxide, has a low thermal-optical effect, is compatible with CMOS processes, and can be formed at a relatively high quality at relatively low temperatures (e.g., less than 400 degrees Celsius). In some other embodiments, the lower optical routing structure 122 may comprise other materials with optical properties such as, for example, polysilicon, amorphous silicon, aluminum nitride, and some polymeric materials. Because the lower optical routing structure 122 is formed on the backside 102*b* of the substrate 102, the lower optical routing structure 122 may be formed using various high-temperature processes and/or may be formed to have desired dimensions without being limited by optical features (e.g., photodiode 112, waveguide 110, upper optical routing structure 108, etc.) arranged on the frontside 102*f* of the substrate 102.

In some embodiments, to further optimize the efficiency of photons (e.g., light) traveling through and between the upper and lower optical routing structures 108, 122, the integrated chip of FIG. 1 may further comprise an upper reflective layer 120, a lower reflective layer 128, and a micro-lens 130. In some embodiments, the upper reflective layer 120 may redirect any escaped light into the upper optical routing structure 108, and the lower reflective layer 128 may redirect any escaped light into the lower optical routing structure 122. Further, in some embodiments, the micro-lens 130 may be arranged on the backside 102*b* of the substrate 102, and an anti-reflective layer 125 may be arranged on the backside 102*b* of the substrate 102 and between the lower dielectric structure 103 and the substrate 102. In some embodiments, the micro-lens 130 may focus diverging light traveling from the lower optical routing structure 122 to the upper optical routing structure 108 to further improve coupling between the lower and upper optical routing structures 122, 108.

Figure 2:
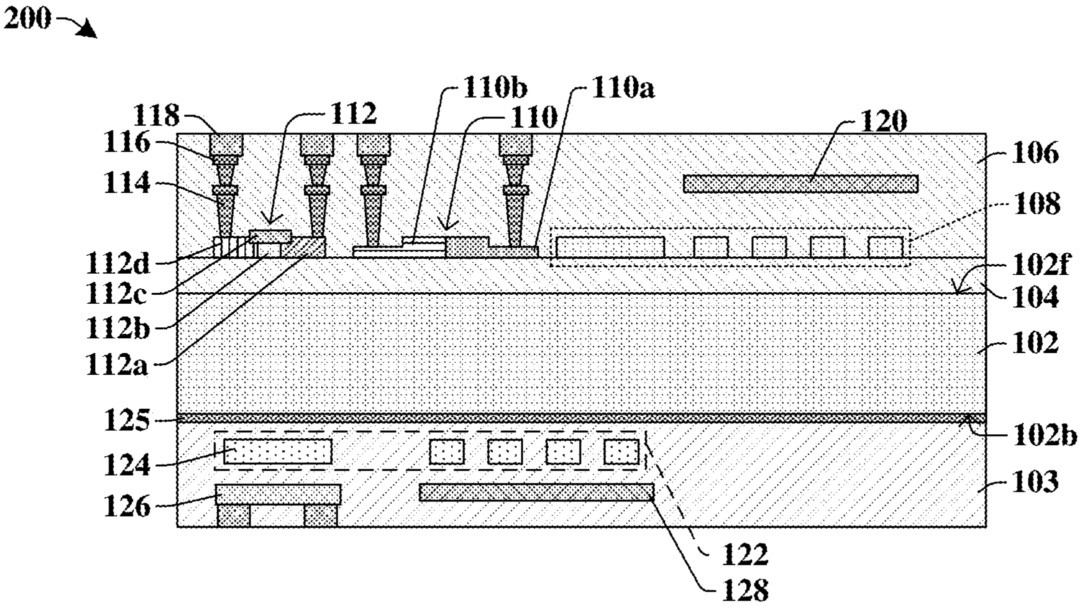
FIG. 2 illustrates a cross-sectional view of some alternative embodiments of an integrated chip having an upper optical routing structure on a frontside of a substrate and a lower optical routing structure on a backside of a substrate.

FIG. 2 illustrates a cross-sectional view 200 of some alternative embodiments of an integrated chip comprising optical routing structures on a frontside and a backside of a substrate.

The cross-sectional view 200 of FIG. 2 includes the substrate 102 without a micro-lens (130 of FIG. 1). In such alternative embodiments without a micro-lens, light may not travel as efficiently between the substrate 102 when compared to embodiments that include the micro-lens (130 of FIG. 1) as in the cross-sectional view 100 of FIG. 1. However, manufacturing efficiency (i.e., time and cost savings) of the integrated chip of FIG. 2 may be increased by omitting the formation of a micro-lens (130 of FIG. 1). In some embodiments, the upper optical routing structure 108 may be arranged directly over the lower optical routing structure 122.

Further, the upper and lower reflective layers 120, 128 may still aid in efficient traveling of light through and/or between the upper and lower optical routing structures 108, 122. In some embodiments, the upper and lower reflective layers 120, 128 may comprise a metal with reflective properties, such as, for example, copper, silver, gold, or the like. In some embodiments, the anti-reflective layer 125 arranged on the backside 102*b* of the substrate 102 is configured to allow light to pass between the lower optical routing structure 122 and the upper optical routing structure 108. In some embodiments, the anti-reflective layer 125 may comprise one or more layers of, for example, silicon dioxide, silicon nitride, silicon oxynitride, or the like.

In some embodiments, the substrate 102 comprises, for example, crystalline silicon. In some embodiments, the substrate 102 is part of a silicon-on-insulator (SOI) substrate, wherein the substrate 102 corresponds to a base substrate of the SOI substrate; the first upper dielectric layer 104 arranged over the substrate 102 corresponds to an insulator layer of the SOI substrate; and the upper optical routing structure 108 may be formed from and correspond to a semiconductor device layer of the SOI substrate arranged over the first upper dielectric layer 104. In some such embodiments, the first upper dielectric layer 104 may comprise, for example, silicon dioxide, and the upper optical routing structure 108 may comprise, for example, silicon or germanium. It will be appreciated that other materials for the substrate 102, the first upper dielectric layer 104, and the upper optical routing structure 108 are within the scope of the disclosure.

Figure 3:
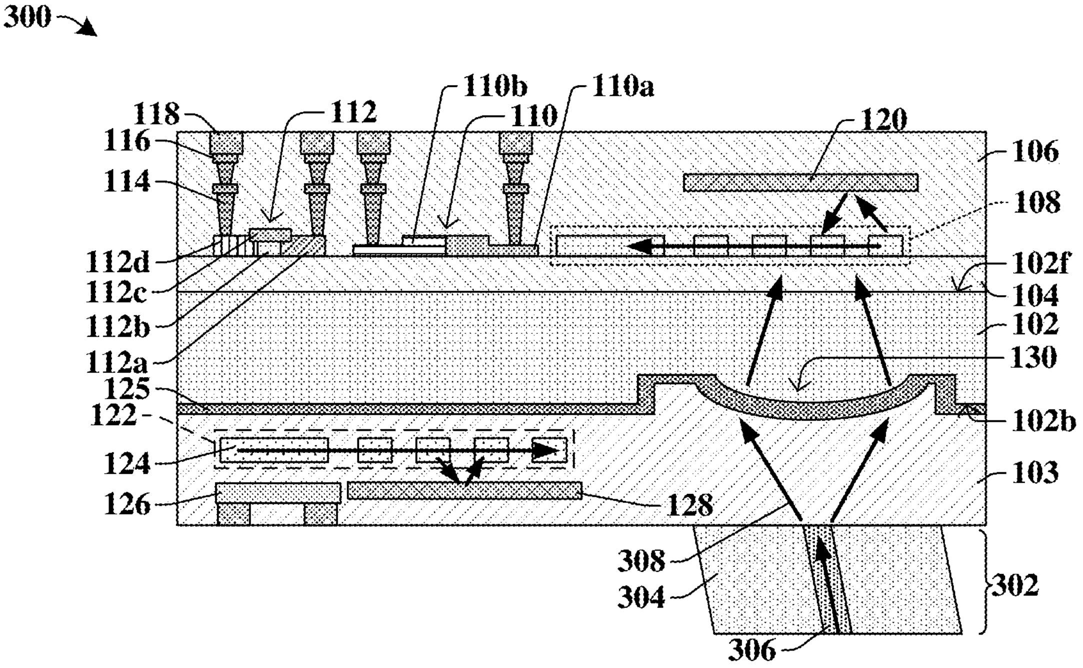

FIG. 3 illustrates a cross-sectional view 300 of some embodiments of a light source arranged on a backside of a substrate and exemplary light paths traveling through and between optical routing structures on a frontside and the backside of the substrate.

The integrated chip in the cross-sectional view 300 includes a light source 302 arranged below the backside 102*b* of the substrate 102 and below the lower dielectric structure 103. In some embodiments, the light source 302 may be arranged directly below the micro-lens 130. In some embodiments, the light source 302 may comprise an optical fiber structure 304, wherein light travels through a core structure 306 of the optical fiber structure 304. In some other embodiments, the light source 302 may be or comprise some other structure, such as a laser source, for example. Nevertheless, in some embodiments, the light source 302 is situated on (i.e., arranged below from the perspective of the cross-sectional view 300) the backside 102*b* of the substrate 102.

The cross-sectional view 300 of FIG. 3 further includes exemplary light paths 308 to illustrate how light may travel through the integrated chip when light is applied towards the backside 102*b* of the substrate 102. In some embodiments, light travels along the exemplary light path 308 through the core structure 306 of the light source 302, and diverges through the lower dielectric structure 103. In some embodiments, the light is re-focused as it travels through the micro-lens 130 and enters the upper optical routing structure 108, for example. Thus, in some embodiments, the micro-lens 130 reduces light scattering a loss of light in the integrated chip. In some embodiments, as exhibited by several of the exemplary light paths 308, the light may be directed through the upper optical routing structure 108 towards the photodiode 112, the waveguide 110, and/or other photonic devices arranged on the frontside 102*f* of the substrate 102. In some embodiments, some of the light traveling through the upper optical routing structure 108 may escape from the upper optical routing structure 108, but then, reflect off of the upper reflective layer 120 to re-enter the upper optical routing structure 108. Thus, the upper reflective layer 120 may increase the optical efficiency through the upper optical routing structure 108.

In some embodiments, as shown through the exemplary light paths 308 illustrated on the lower optical routing structure 122, in some embodiments, light may also travel through the lower optical routing structure 122. In some embodiments, the light traveling through the lower optical routing structure 122 may originate from some other light source (not pictured) than the light source 302. In some embodiments, some of the light traveling through the lower optical routing structure 122 may escape from the lower optical routing structure 122 but then, reflect off of the lower reflective layer 128 to re-enter the lower optical routing structure 122. Thus, the lower reflective layer 128 may increase the optical efficiency through the lower optical routing structure 122.

Because the light source 302 is arranged on the backside 102*b* of the substrate 102, features on the frontside 102*f* of the substrate 102 may be optimized without the structural and manufacturing limitations of the light source 302, which may be a rather large feature. For example, in some embodiments, the optical fiber structure 304 may be a width in a range of between, for example, approximately 100 micrometers and approximately 150 micrometers. Further, in some embodiments, the frontside 102*f* of the substrate 102 may be coupled to other electronic and/or optical circuitry through the contact pads 118 and without interference of a light source 302. Thus, because the frontside 102*f* and the backside 102*b* of the substrate 102 are utilized, the device density of the integrated chip may be increased.

Figure 4:
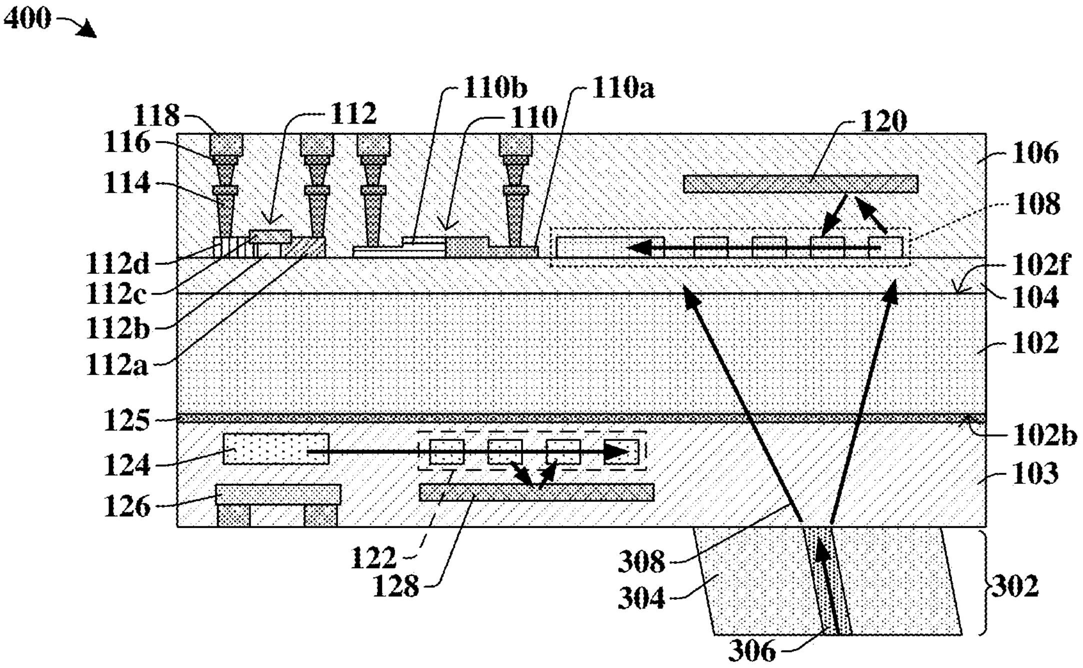

FIG. 4 illustrates a cross-sectional view 400 of some alternative embodiments of an integrated chip comprising a light source arranged on a backside of a substrate and exemplary light paths traveling through and between optical routing structures on a frontside and the backside of the substrate.

The integrated chip of the cross-sectional view 400 does not include a micro-lens (130 of FIG. 3) between the frontside 102*f* and the backside 102*b* of the substrate 102. In such embodiments, light diverges from the light source 302 to the upper optical routing structure 108 as shown by the exemplary light path 308. In such embodiments without a micro-lens (130 of FIG. 3) to focus the light towards the upper optical routing structure 108, some light may be lost within the integrated chip and not transferred from the light source 302 to the upper optical routing structure 108. However, in some embodiments, without a micro-lens (130 of FIG. 3), the integrated chip may be more cost-effective to manufacture.

Figure 5:
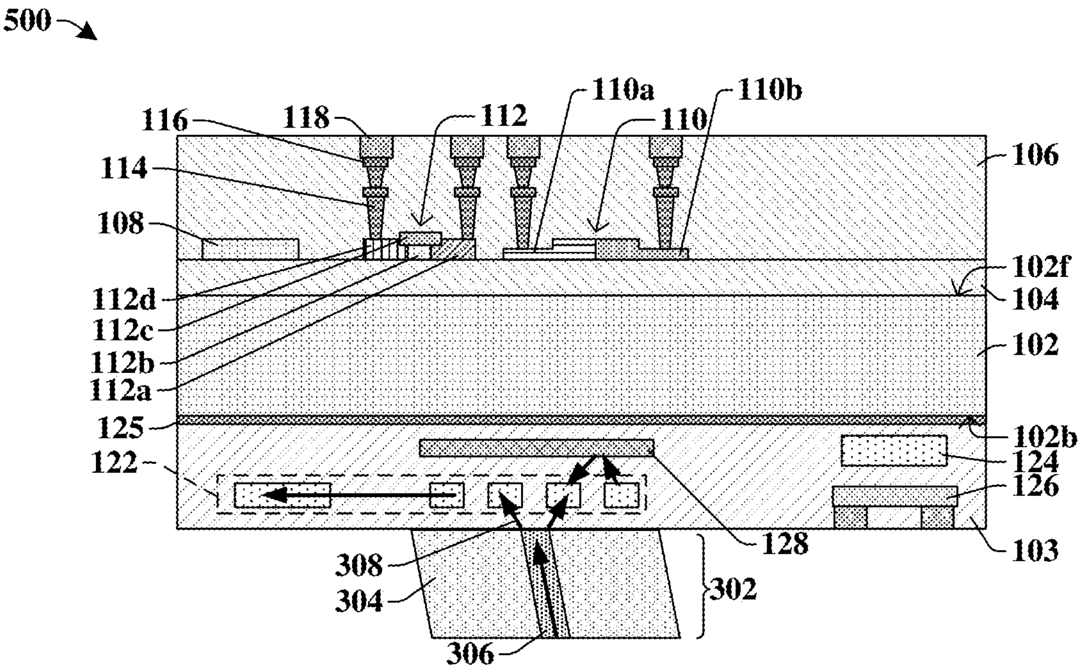

FIG. 5 illustrates a cross-sectional view 500 of some other alternative embodiments of an integrated chip comprising a light source arranged on a backside of a substrate and exemplary light paths traveling through and between optical routing structures on a frontside and the backside of the substrate.

In some embodiments, the light source 302 may be arranged directly below the lower optical routing structure 122. In some embodiments, the lower optical routing structure 122 may be arranged directly between the lower reflective layer 128 and the light source 302. In such embodiments, as illustrated by the exemplary light paths 308, light may travel to the lower optical routing structure 122 from the light source 302. Further, in some embodiments, some light may escape from the lower optical routing structure 122 and be re-directed to the lower optical routing structure 122 by reflecting from the lower reflective layer 128. In some embodiments, through more optical routing features (not pictured) such as, for example, grating structures, optical routing guides, reflective layers, micro-lenses, or the like, the light may travel from the backside 102*b* of the substrate 102 towards the frontside 102*f* of the substrate 102 and travel through photonic devices (e.g., photodiode 112, waveguide 110, etc.) arranged on the frontside 102*f* of the substrate 102.

Figure 6A:
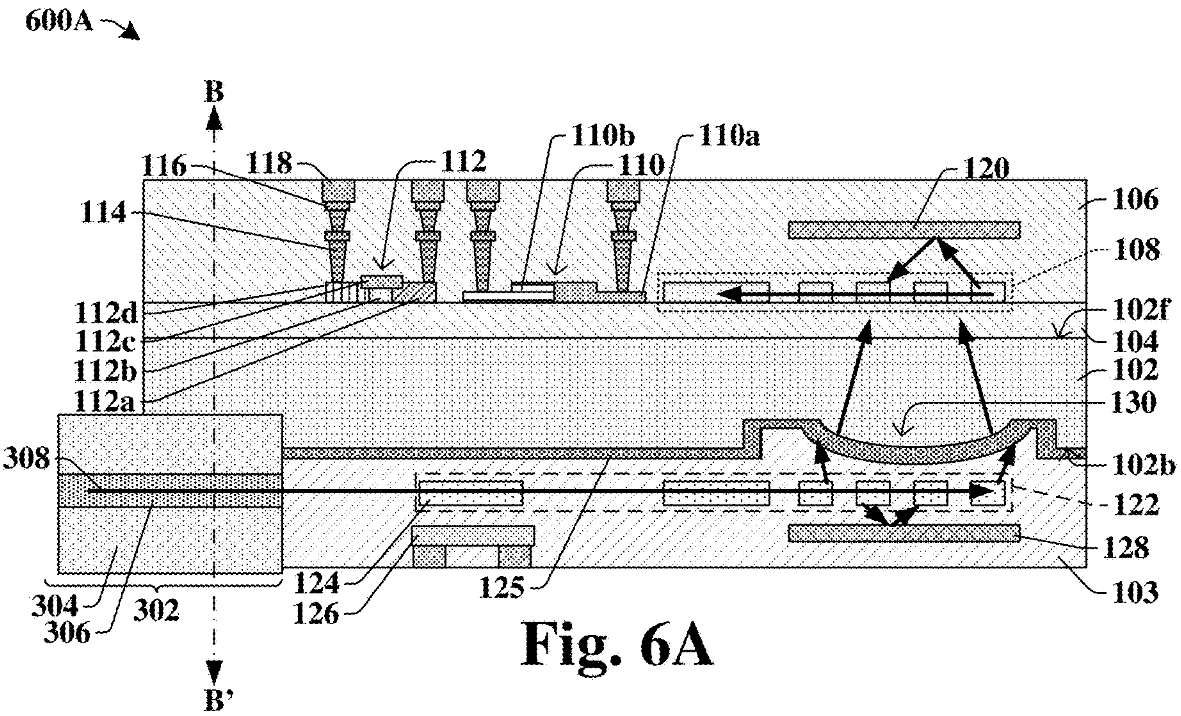

FIG. 6A illustrates a cross-sectional view 600A of some embodiments of an integrated chip comprising a light source arranged on a backside of a substrate and configured to direct light to an optical routing structure from a side of the integrated chip.

In some embodiments, the optical fiber structure 304 may be arranged on the backside 102*b* of the substrate 102 and configured to direct light into the lower optical routing structure 122 from a side of the lower dielectric structure 103. In such embodiments, the core structure 306 of the light source 302 may be configured to direct light parallel to the backside 102*b* of the substrate 102, as illustrated by the exemplary light path 308 on the core structure 306 and the lower optical routing structure 122.

In some embodiments, the micro-lens 130 may be arranged directly over the lower optical routing structure 122. Further, in some embodiments, the micro-lens 130 may be arranged directly between the upper and lower optical routing structures 108, 122. Thus, in some embodiments, light may travel through the micro-lens 130 from the lower optical routing structure 122 to the upper optical routing structure 108. In some embodiments, the micro-lens 130 may be concave-out towards the lower optical routing structure 122 and concave-in towards the upper optical routing structure 108. In some embodiments, the micro-lens 130 may have a lower surface that is arranged above a bottommost surface of the substrate 102. In some embodiments, the micro-lens 130 is formed through a patterning process on the backside 102*b* of the substrate 102, and thus, the micro-lens 130 may comprise a same material as the substrate 102.

In some embodiments, the optical fiber structure 304 may be arranged above the bottommost surface of the substrate 102. In some embodiments, the optical fiber structure 304 may have a height in a range of between, for example, approximately 100 micrometers and approximately 150 micrometers, for example. In some embodiments, because the optical fiber structure 304 is arranged on the backside 102*b* of the substrate 102, the frontside 102*f* of the substrate 102 may be further utilized electrical packaging without interference from and limitations by the large-sized optical fiber structure 304, thereby increasing device density.

Figure 6B:
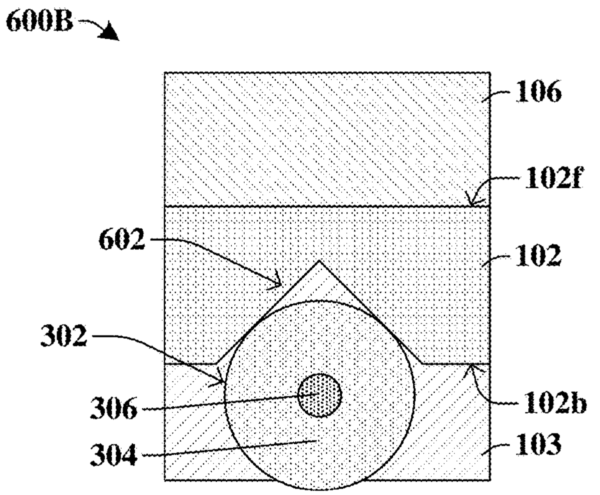
FIG. 6B illustrates a cross-sectional view of some embodiments of an optical fiber structure arranged on a backside of a substrate.

FIG. 6B illustrates a cross-sectional view 600B of some embodiments of the optical fiber structure of FIG. 6A. In some embodiments, the cross-sectional view 600B of FIG. 6B corresponds to cross-section line BB' of FIG. 6A.

In some embodiments, the optical fiber structure 304 may have a substantially circular cross-section. Other shapes of the optical fiber structure 304 from the cross-sectional view 600B are also within the scope of the disclosure. In some embodiments, the optical fiber structure 304 is arranged above a bottommost surface of the substrate 102 to reduce the size of the integrated chip. Thus, in some embodiments, a v-shaped groove 602 is formed by removing portions of the substrate 102 from the backside 102*b* of the substrate 102. Then, the optical fiber structure 304 may be arranged within the lower dielectric structure 103 and within the v-shaped groove 602 on the backside 102*b* of the substrate 102, in some embodiments, to increase device density of the overall integrated chip.

FIGS. 7-18 illustrate cross-sectional views 700-1800 of some embodiments of a method of forming a lower optical routing structure on a backside of a silicon-on-insulator (SOI) substrate followed by forming an upper optical routing structure on a frontside of the SOI substrate. Although FIGS. 7-18 are described in relation to a method, it will be appreciated that the structures disclosed in FIGS. 7-18 are not limited to such a method, but instead may stand alone as structures independent of the method.

Figure 7:
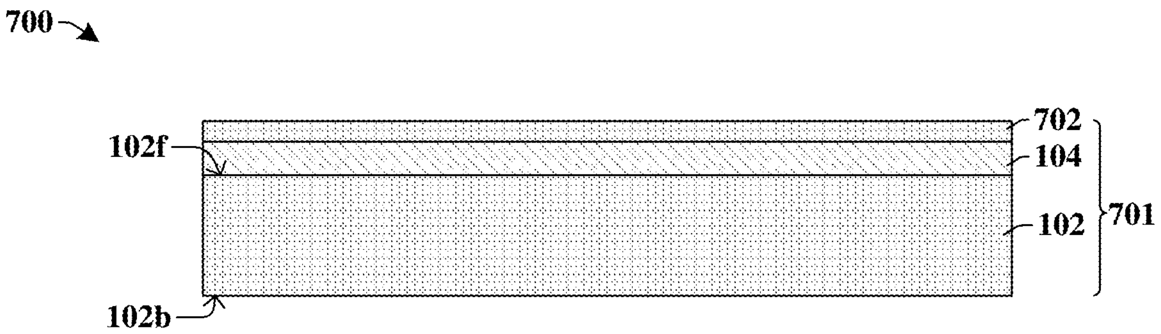
FIGS. 7-18 illustrate cross-sectional views of some embodiments of a method of forming a lower optical routing structure on a backside of a silicon-on-insulator (SOI) substrate followed by forming an upper optical routing structure on a frontside of the SOI substrate.

As shown in cross-sectional view 700 of FIG. 7, a silicon-on-insulator (SOI) substrate 701 is provided. The SOI substrate 701 may comprise a substrate 102, a first upper dielectric layer 104 arranged over the substrate 102, and a semiconductor device layer 702 arranged over the first upper dielectric layer 104. In some embodiments, the substrate 102 may comprise a crystalline semiconductor material (e.g., silicon, germanium, etc) Similarly, the semiconductor device layer 702 may also comprise a semiconductor material such as, for example, silicon, germanium, or the like. In some embodiments, the first upper dielectric layer 104 comprises, for example, a bulk oxide, such as silicon dioxide. In some other embodiments, the first upper dielectric layer 104 may comprise, for example, a nitride, a carbide, or some other dielectric material. In some embodiments, the SOI substrate 701 may be formed by way of various deposition and/or bonding processes. In some other embodiments, the SOI substrate 701 may be or comprise some other type of semiconductor body (e.g., silicon/CMOS bulk, SiGe, etc.).

Further, in some embodiments, a frontside 102*f* of the substrate 102 is located at an interface between the first upper dielectric layer 104 and the substrate 102, and a backside 102*b* of the substrate 102 is opposite to the frontside 102*f* of the substrate 102.

Figure 8:
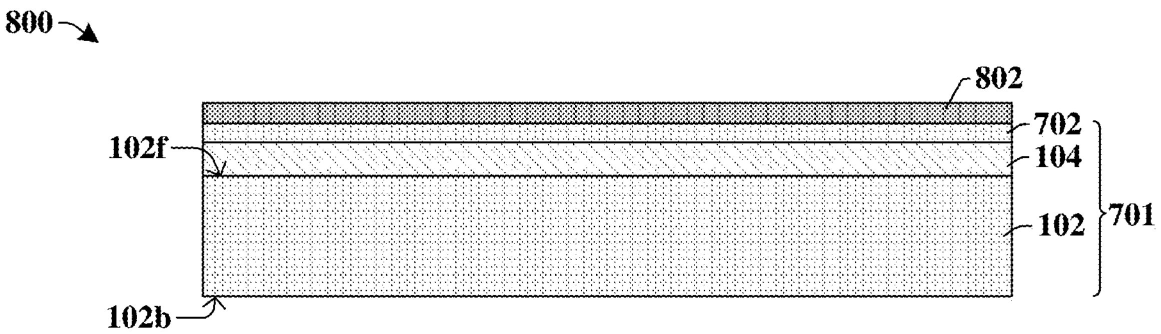

As shown in cross-sectional view 800 of FIG. 8, a passivation layer 802 is formed over the frontside 102*f* of the substrate 102 and on the semiconductor device layer 702. In some embodiments, the passivation layer 802. In some embodiments, the passivation layer 802 may comprise, for example, an oxide (e.g., silicon dioxide), a nitride (e.g., silicon nitride, silicon oxynitride), a carbide (e.g., silicon carbide), or the like. In some embodiments, the passivation layer 802 may be formed by way of a thermal oxidation or deposition process (e.g., physical vapor deposition (PVD), chemical vapor deposition (CVD), plasma-enhanced CVD (PE-CVD), atomic layer deposition (ALD), etc.).

Figure 9:
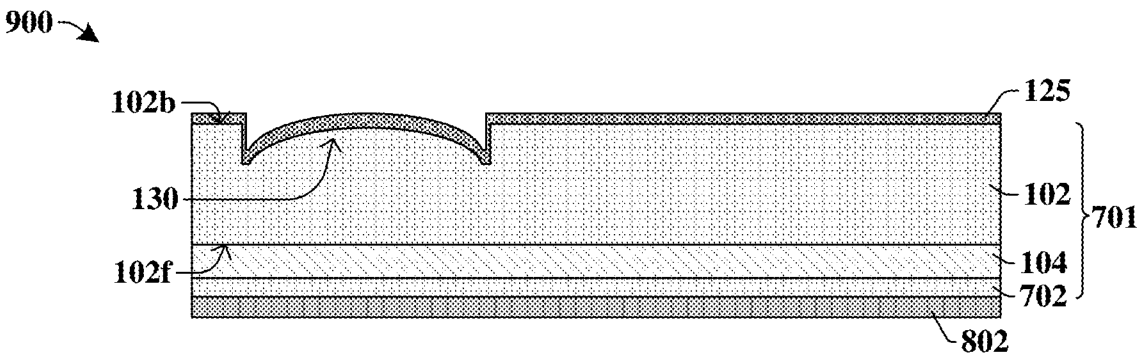

As shown in cross-sectional view 900 of FIG. 9, in some embodiments, the SOI substrate 701 is flipped over, such that the backside 102*b* of the substrate 102 is facing "up" to be patterned. The passivation layer 802 may protect the semiconductor device layer 702 as the SOI substrate 701 is flipped over. In some embodiments, after flipping over the SOI substrate 701, a micro-lens 130 may be formed on the backside 102*b* of the substrate 102. In such embodiments, the micro-lens 130 through various steps of photolithography and removal (e.g., dry etching) processes. Thus, in some embodiments, the micro-lens 130 is formed by removing portions of the substrate 102. Therefore, in some embodiments, the micro-lens 130 comprises a same material as the substrate 102. In some embodiments, the micro-lens 130 has a curved upper surface from the cross-sectional view 900. In some embodiments, the micro-lens 130 is arranged below an uppermost surface of the backside 102*b* of the substrate 102 from the perspective of the cross-sectional view 900, wherein the backside 102*b* of the substrate 102 is facing "up." In some other embodiments, the formation of the micro-lens 130 is omitted.

In some embodiments, an anti-reflective layer 125 is formed over the backside 102*b* of the substrate 102 and the micro-lens 130. In some embodiments, the anti-reflective layer 125 may comprise, for example, silicon dioxide, silicon nitride, silicon oxynitride, or some other suitable dielectric material. Further, in some embodiments, more than one anti-reflective layer 125 may be formed on the backside 102*b* of the substrate 102. In some embodiments, the anti-reflective layer 125 may be formed by way of a deposition process (e.g., PVD, CVD, PE-CVD, ALD, etc.).

Figure 10:
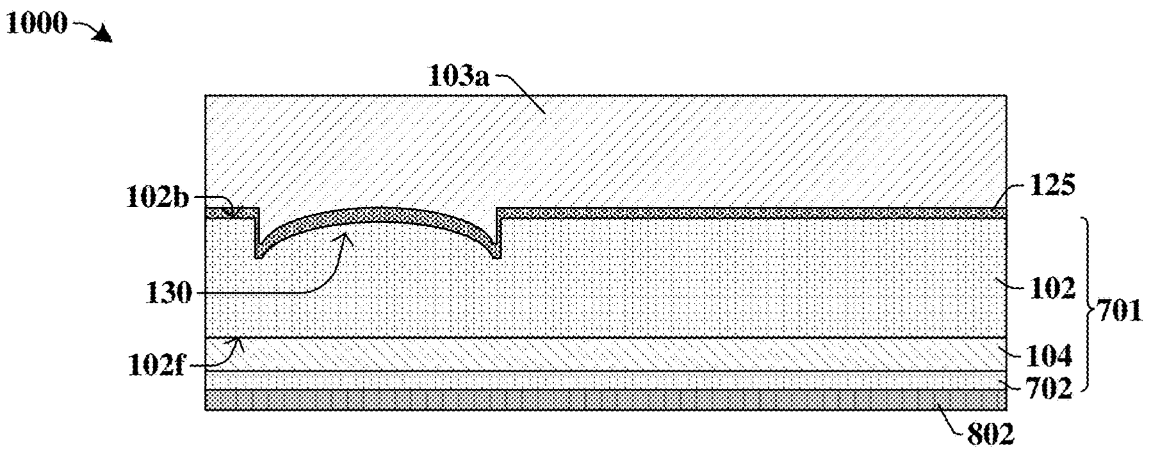

As shown in cross-sectional view 1000 of FIG. 10, in some embodiments, a first lower dielectric layer 103*a* is formed over the anti-reflective layer 125 on the backside 102*b* of the substrate 102. In some embodiments, the first lower dielectric layer 103*a* may comprise a dielectric material that allows light to pass through, such as, for example, silicon dioxide, silicon nitride, or the like. In some embodiments, the first lower dielectric layer 103*a* may be formed by way of a deposition process (e.g., PVD, CVD, PE-CVD, ALD, etc.). In some embodiments, to form the first lower dielectric layer 103*a*, the material of the first lower dielectric layer 103*a* is deposited and then, a planarization process (e.g., chemical mechanical planarization (CMP)) is performed such that the first lower dielectric layer 103*a* has a substantially planar upper surface. In some embodiments, the first lower dielectric layer 103*a* may have a thickness in a range of between, for example, approximately 500 nanometers and approximately 5 micrometers.

Figure 11:
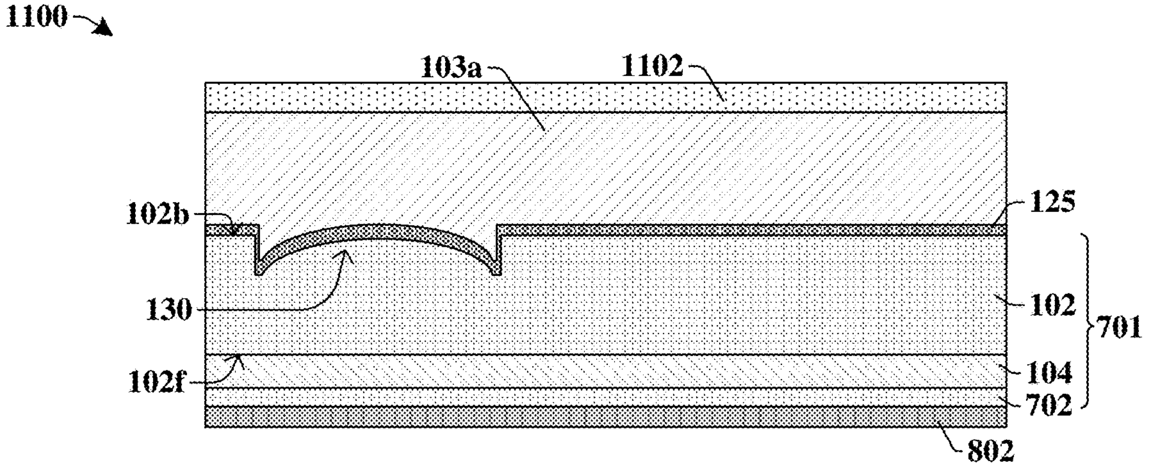

As shown in cross-sectional view 1100 of FIG. 11, in some embodiments, an optical routing layer 1102 may be formed over the first lower dielectric layer 103*a*. In some embodiments, the optical routing layer 1102 may comprise, for example, silicon nitride. In some embodiments, the optical routing layer 1102 may be formed by a deposition process (e.g., PVD, CVD, PE-CVD, ALD, sputtering, etc.) followed by an annealing process. For example, in some embodiments, after the deposition of the material of the optical routing layer 1102, the annealing process may be conducted at a high temperature (e.g., between about 900 degrees Celsius and about 1100 degrees Celsius) for a time period in a range of about 1 hour to about 48 hours. Because the optical routing layer 1102 is formed on the backside 102*b* of the substrate 102 prior to forming photonic devices on the frontside 102*f* of the substrate 102, damage to photonic devices on the frontside 102*f* of the substrate 102 from the high temperatures during the annealing of the optical routing layer 1102 is prevented. In some embodiments, the optical routing layer may have a thickness in a range of between, for example, approximately 0.1 micrometers and approximately 1 micrometer. In some other embodiments, the optical routing layer 1102 may comprise, for example, polysilicon, amorphous silicon, aluminum nitride, aluminum oxide, a polymeric material, or some other suitable material that allows and guides light traveling through.

Figure 12:
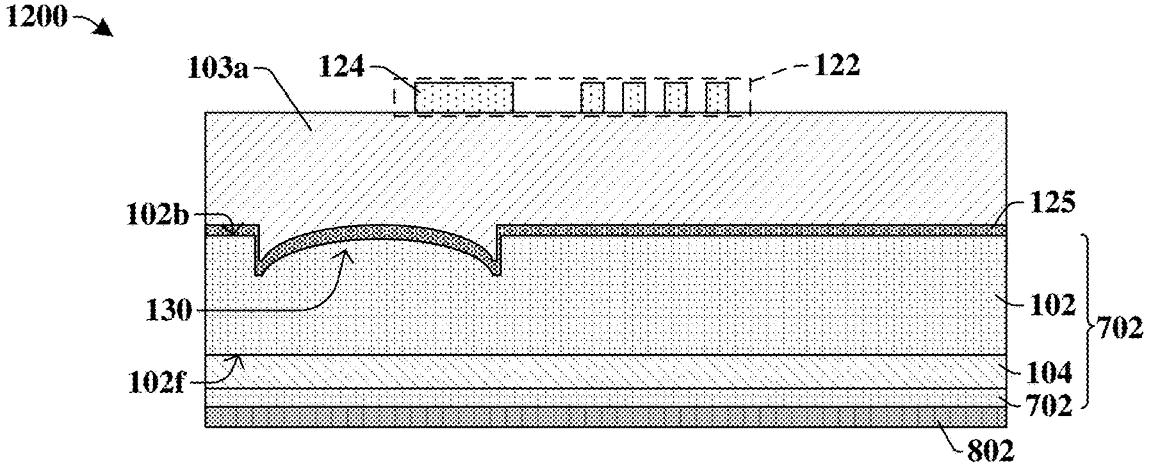

As shown in cross-sectional view 1200 of FIG. 12, in some embodiments, a patterning process is performed to remove portions of the optical routing layer (1102 of FIG. 11) to form a lower optical routing structure 122 on the backside 102*b* of the substrate 102. In some embodiments, the lower optical routing structure 122 comprises a grating structure and/or an optical routing guide. In some embodiments, the optical routing guide is a heating portion 124 of the lower optical routing structure 122. In some embodiments, the patterning process used to form the lower optical routing structure 122 comprises photolithography and removal (e.g., etching) processes. In some embodiments, at least some of the lower optical routing structure 122 directly overlies the micro-lens 130.

Figure 13:
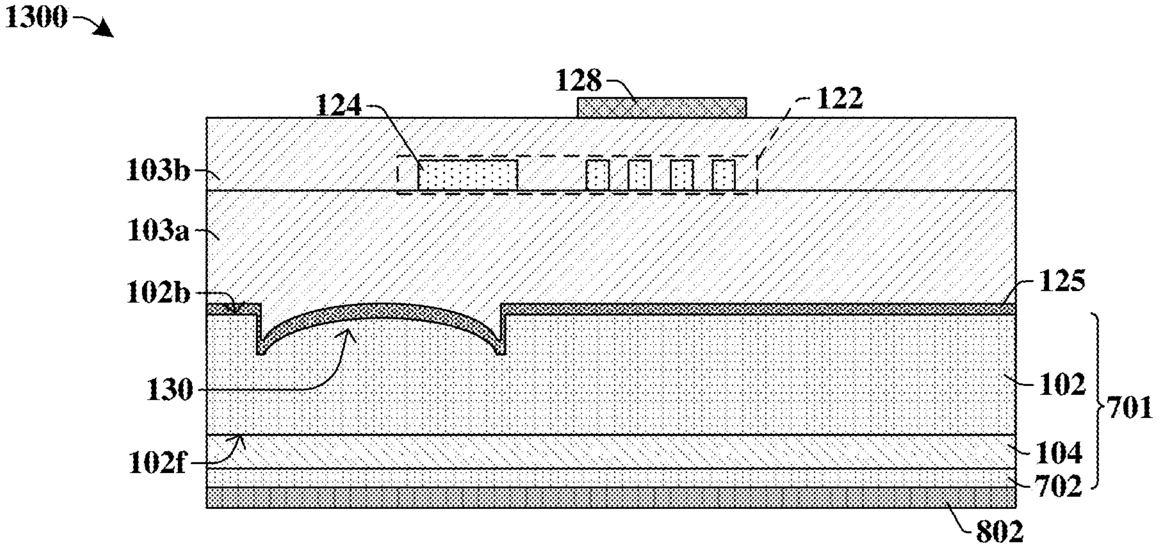

As shown in cross-sectional view 1300 of FIG. 13, in some embodiments, a second lower dielectric layer 103*b* is formed over the lower optical routing structure 122. In some embodiments, the second lower dielectric layer 103*b* comprises, for example, silicon dioxide or some other suitable dielectric layer that allows light to pass through. In some embodiments, the second lower dielectric layer 103*b* comprises a same material as the first lower dielectric layer 103*a*. In some embodiments, the second lower dielectric layer 103*b* is formed by way of a deposition process (e.g., PVD, CVD, PE-CVD, ALD, etc.). In some embodiments, the second lower dielectric layer 103*b* undergoes a planarization process (e.g., CMP) after the deposition process such that the second lower dielectric layer 103*b* has a substantially planar upper surface.

In some embodiments, a lower reflective layer 128 is formed directly over the lower optical routing structure 122 and over the second lower dielectric layer 103*b*. In some embodiments, the lower reflective layer 128 comprises a reflective metal, such as, for example, copper, silver, gold, or the like. In some embodiments, the lower reflective layer 128 is formed by way of a deposition process (e.g., PVD, CVD, PE-CVD, ALD, sputtering, etc.), followed by photolithography and removal (e.g., etching) processes.

Figure 14:
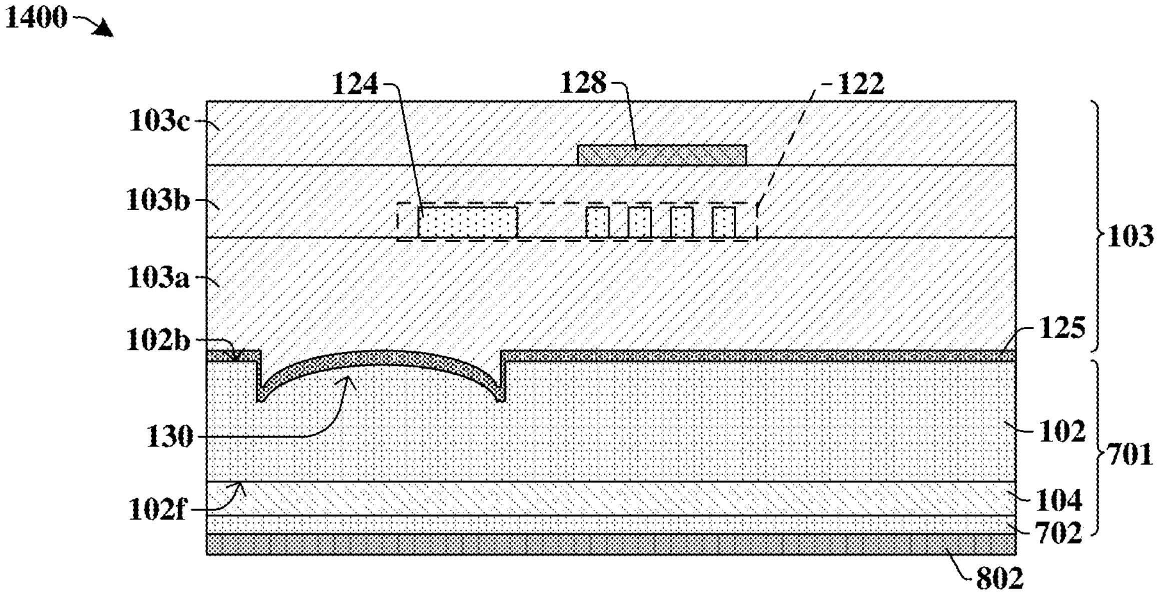

As shown in cross-sectional view 1400 of FIG. 14, a third lower dielectric layer 103*c* is formed over the second lower dielectric layer 103*b* and the lower reflective layer 128. In some embodiments, the third lower dielectric layer 103*c* comprises, for example, silicon dioxide or some other suitable dielectric layer that allows light to pass through. In some embodiments, the third lower dielectric layer 103_c_ comprises a same material as the first lower dielectric layer 103_a_ and/or the second lower dielectric layer 103_b_. In some embodiments, the third lower dielectric layer 103_c_ is formed by way of a deposition process (e.g., PVD, CVD, PE-CVD, ALD, etc.). In some embodiments, the third lower dielectric layer 103_c_ undergoes a planarization process (e.g., CMP) after the deposition process such that the third lower dielectric layer 103_c_ has a substantially planar upper surface. In some embodiments, the first, second, and third lower dielectric layers 103_a_, 103_b_, 103_c_ make up a lower dielectric structure 103 arranged on the backside 102_b_ of the substrate 102.

Figure 15:
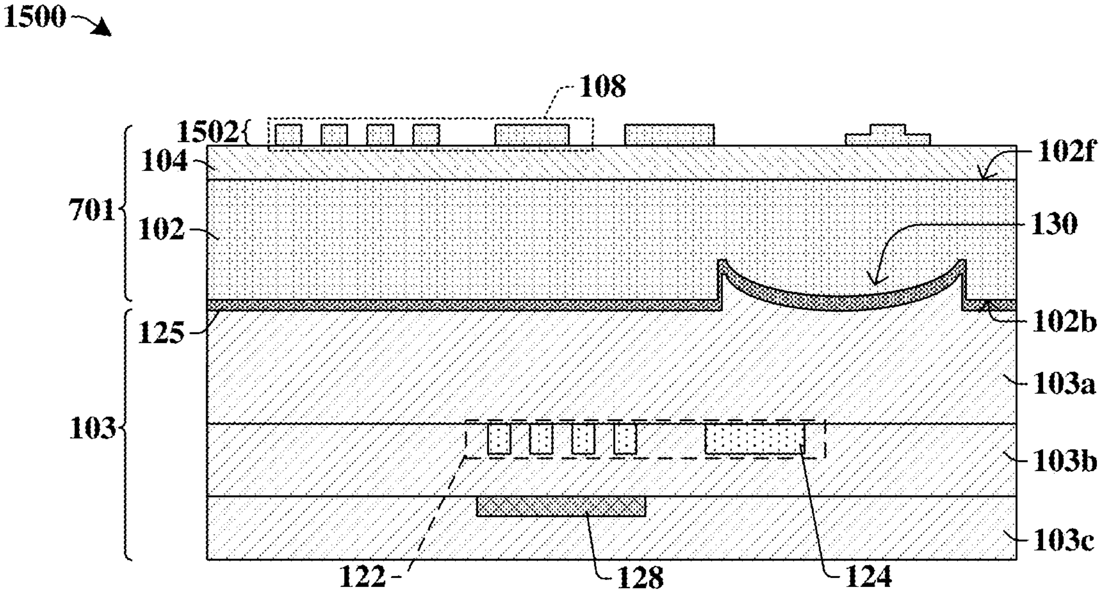

As shown in cross-sectional view 1500 of FIG. 15, in some embodiments, the SOI substrate 701 is again flipped over, such that the frontside 102_f_ of the substrate 102 is facing "up" to be patterned. The third lower dielectric layer 103_c_ may protect the features (e.g., lower optical routing structure 122, lower reflective layer 128) as the SOI substrate 701 is flipped over.

In some embodiments, after the SOI substrate 701 is flipped over, the passivation layer (802 of FIG. 14) may be removed. In some embodiments, the passivation layer (802 of FIG. 14) is removed by way of a wet etching process or a dry etching process, wherein the semiconductor device layer (702 of FIG. 14) is substantially resistant to removal by the wet or dry etching processes. In some embodiments, after the passivation layer (802 of FIG. 14) is removed, a patterning process is performed to remove portions of the semiconductor device layer (702 of FIG. 14) to form a patterned semiconductor device layer 1502. In some embodiments, the patterned semiconductor device layer 1502 comprises at least an upper optical routing structure 108. In some embodiments, the upper optical routing structure 108 comprises a grating structure and/or an optical routing guide. In some embodiments, the upper optical routing structure 108 is formed directly over the micro-lens 130, whereas in other embodiments, the upper optical routing structure 108 does not directly overlie the micro-lens 130. In some embodiments, the patterning process used to form the patterned semiconductor device layer 1502 comprises photolithography and removal (e.g., etching) processes.

Figure 16:
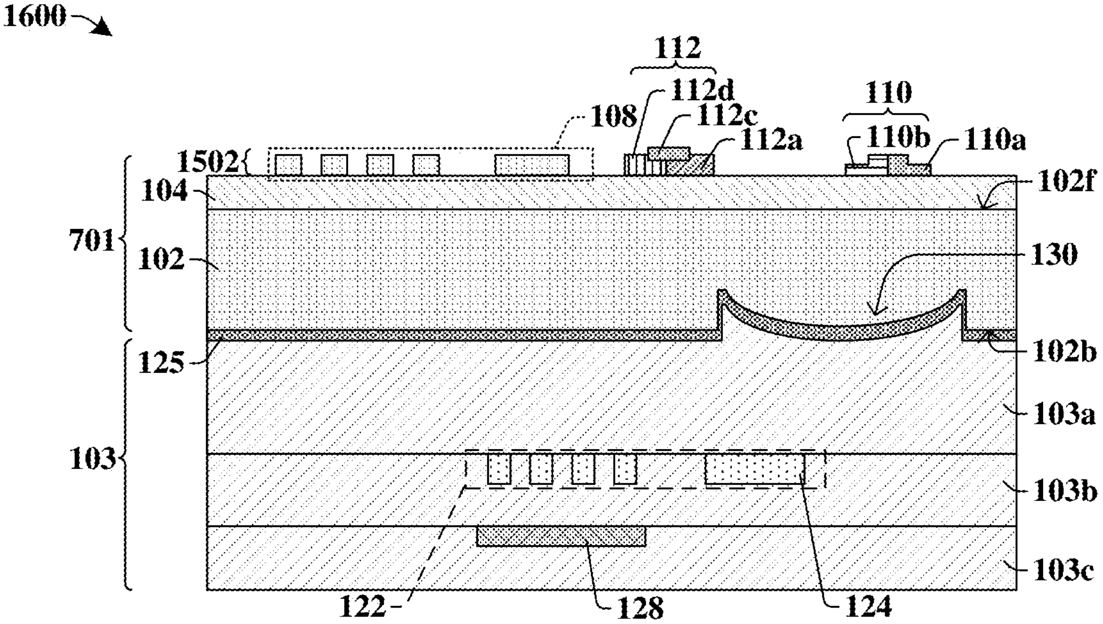

As shown in cross-sectional view 1600 of FIG. 16, in some embodiments, various doping and/or ion implantation processes are performed on portions of the patterned semiconductor device layer 1502 to form photonic devices over the frontside 102_f_ of the substrate 102, such as, for example, a photodiode 112 and a waveguide 110. The photodiode 112 may be arranged laterally beside the upper optical routing structure 108 and comprise a first outer doped portion 112_a_, a second outer doped portion 112_d_, and an upper undoped portion 112_c_ arranged between the first and second outer doped portions 112_a_, 112_d_. In some embodiments, the first outer doped portion 112_a_ may comprise a different doping type than the second outer doped portion 112_d_. For example, in some embodiments, the first outer doped portion 112_a_ may be p-type, whereas the second outer doped portion 112_d_ may be n-type. In some embodiments, the photodiode 112 may comprise silicon and/or germanium. The photodiode 112 may be configured to receive light and transmit the light into a digital signal.

In some embodiments, the waveguide 110 may comprise a first doped portion 110_a_ and a second doped portion 110_b_ beside the first doped portion 110_a_. In some embodiments, the first doped portion 110_a_ may have a different doped type than the second doped portion 110_b_. For example, in some embodiments, the first doped portion 110_a_ may be p-type, whereas the second doped portion 110_b_ may be n-type. In some embodiments, the waveguide may comprise silicon and/or germanium. In some embodiments, the waveguide 110 may be part of a modulator that is configured to selectively change the phase, wavelength, frequency, and/or other properties of light that passes through the waveguide 110.

It will be appreciated that photonic devices (e.g., photodetectors, modulators, etc.) other than photodiodes 112 and waveguides 110 may be formed over the frontside 102_f_ of the substrate 102 and are within the scope of this disclosure.

Because the photonic devices such as the photodiode 112 and the waveguide 110 are formed after the formation of the lower optical routing structure 122, damage to the photodiode 112 and the waveguide 110 due to heating processes (e.g., annealing) to form the lower optical routing structure 122 is mitigated. Further, the bottom surfaces of the upper optical routing structure 108, the photodiode 112, and the waveguide 110 may be substantially coplanar because a light source may be arranged on the backside 102_b_ of the substrate 102. In other words, spacing limitations of the upper optical routing structure 108, the photodiode 112, and the waveguide 110 due to a light source are omitted, and device density is increased.

Figure 17:
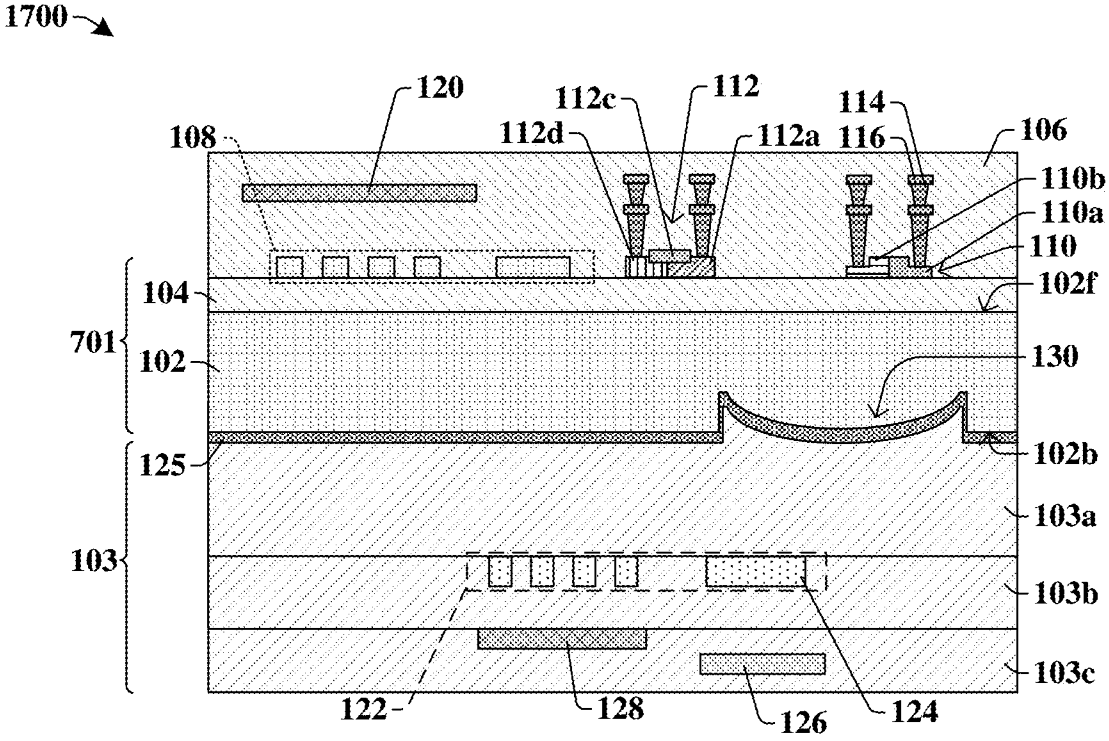

As shown in cross-sectional view 1700 of FIG. 17, in some embodiments, a second upper dielectric layer 106 is formed over the first upper dielectric layer 104, the upper optical routing structure 108, the photodiode 112, and the waveguide 110. In some embodiments, the second upper dielectric layer 106 is formed by way of the same processes (e.g., deposition processes and planarization processes) used to form the first lower dielectric layer 103_a_, the second lower dielectric layer 103_b_, and/or the third lower dielectric layer 103_c_. Further, in some embodiments, the second upper dielectric layer 106 may comprise, for example, silicon dioxide or some other suitable dielectric layer that allows light to pass through. In some embodiments, the second upper dielectric layer 106 may actually comprise multiple dielectric layers.

Further, in some embodiments, metal routing may be formed and coupled to the photonic devices (e.g., photodiode 112, waveguide 110) for electrical signal transmission. For example, in some embodiments, the metal routing includes interconnect vias 114 and interconnect wires 116. In some embodiments, the interconnect vias 114 and the interconnect wires 116 may be formed by way of a damascene or dual-damascene process that includes various steps of deposition processes (e.g., PVD, CVD, PE-CVD, ALD, sputtering, etc.), patterning processes (e.g., photolithography), and removal processes (e.g., etching, CMP, etc.). In some embodiments, the interconnect vias 114 and the interconnect wires 116 comprise conductive materials such as, for example, tungsten, copper, aluminum, or some other suitable conductive material.

Further, in some embodiments, an upper reflective layer 120 is formed within the second upper dielectric layer 106 and directly over the upper optical routing structure 108. In some embodiments, the upper reflective layer 120 comprises a reflective material such as, for example, copper, silver, gold, or the like. In some embodiments, the upper reflective layer 120 is formed by way of a deposition process (e.g., PVD, CVD, PE-CVD, ALD, sputtering, etc.) followed by photolithography and removal (e.g., etching) processes.

Further, in some embodiments, a heater device 126 is formed within the third lower dielectric layer 103_c_ and arranged directly below the heating portion 124 of the lower optical routing structure 122. In some embodiments, the heater device 126 is formed by flipping the SOI substrate 701 over such that the third lower dielectric layer 103*c* is facing "up" and patterning processes (e.g., photolithography), removal processes (e.g., etching, CMP, etc.), and deposition processes (e.g., PVD, CVD, PE-CVD, ALD, sputtering, etc.). In some other embodiments, the heater device 126 is formed after the formation of the lower reflective layer 128 in FIG. 14 and before FIG. 15 while the third lower dielectric layer 103*c* is already facing "up" to increase manufacturing efficiency.

Figure 18:
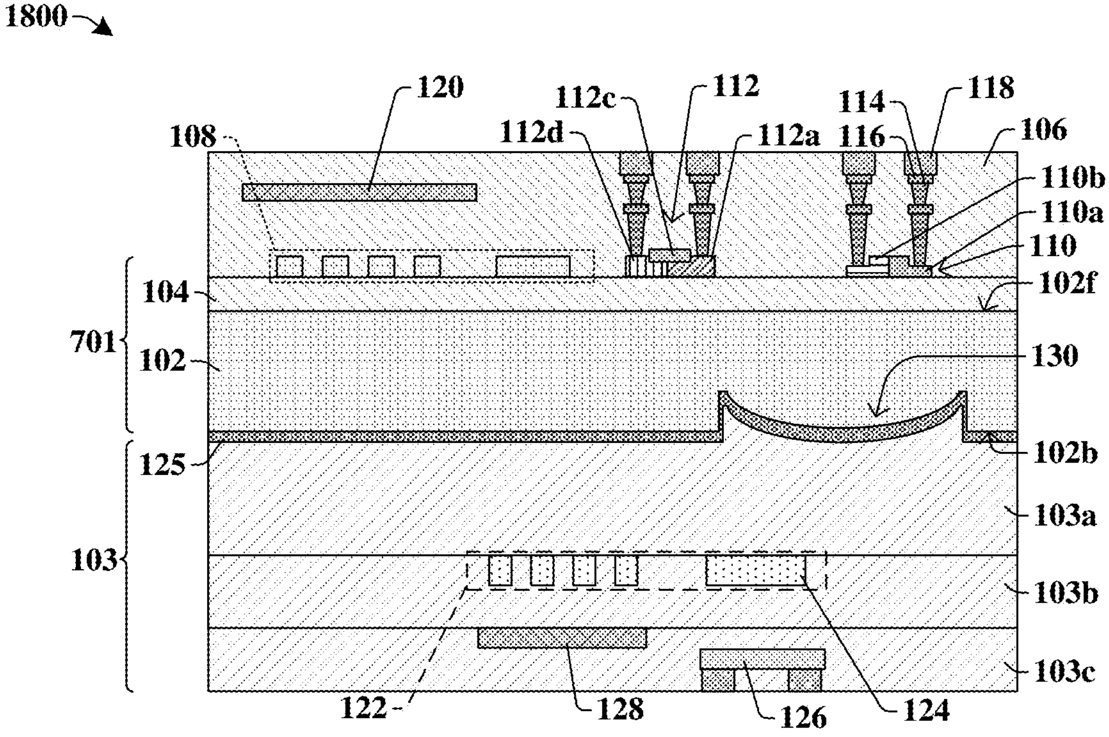

As shown in cross-sectional view 1800 of FIG. 18, in some embodiments, contact pads 118 are formed within the second upper dielectric layer 106 and within the lower dielectric structure 103. In some embodiments, the contact pads 118 are formed by way of patterning processes (e.g., photolithography), removal processes (e.g., etching, CMP, etc.), and deposition processes (e.g., PVD, CVD, PE-CVD, ALD, sputtering, etc.). In some embodiments, the contact pads 118 comprise a conductive material such as, for example, copper, tungsten, lead, aluminum, or some other suitable conductive material. In some embodiments, the contact pads 118 are uncovered by the second upper dielectric layer 106 and the lower dielectric structure 103 such that the contact pads 118 may be coupled to other electrical circuitry not shown. In some embodiments, the contact pads 118 are coupled to the photodiode 112, the waveguide 110, and the heater device 126. The contact pads 118 allow features on the backside 102*b* of the substrate 102 and features on the frontside 102*f* of the substrate 102 to be accessed.

In some embodiments, a light source, such as an optical fiber structure 304 may be coupled to the backside 102*b* of the substrate 102 and directed towards the lower optical routing structure 122 and/or the micro-lens 130 as illustrated in, for example, FIGS. 3-6A. When light is applied to the backside 102*b* of the substrate 102, it may travel through the lower optical routing structure 122, the micro-lens 130, and the substrate 102 to enter the upper optical routing structure 108, the photodiode 112, and/or the waveguide 110.

Figure 19:
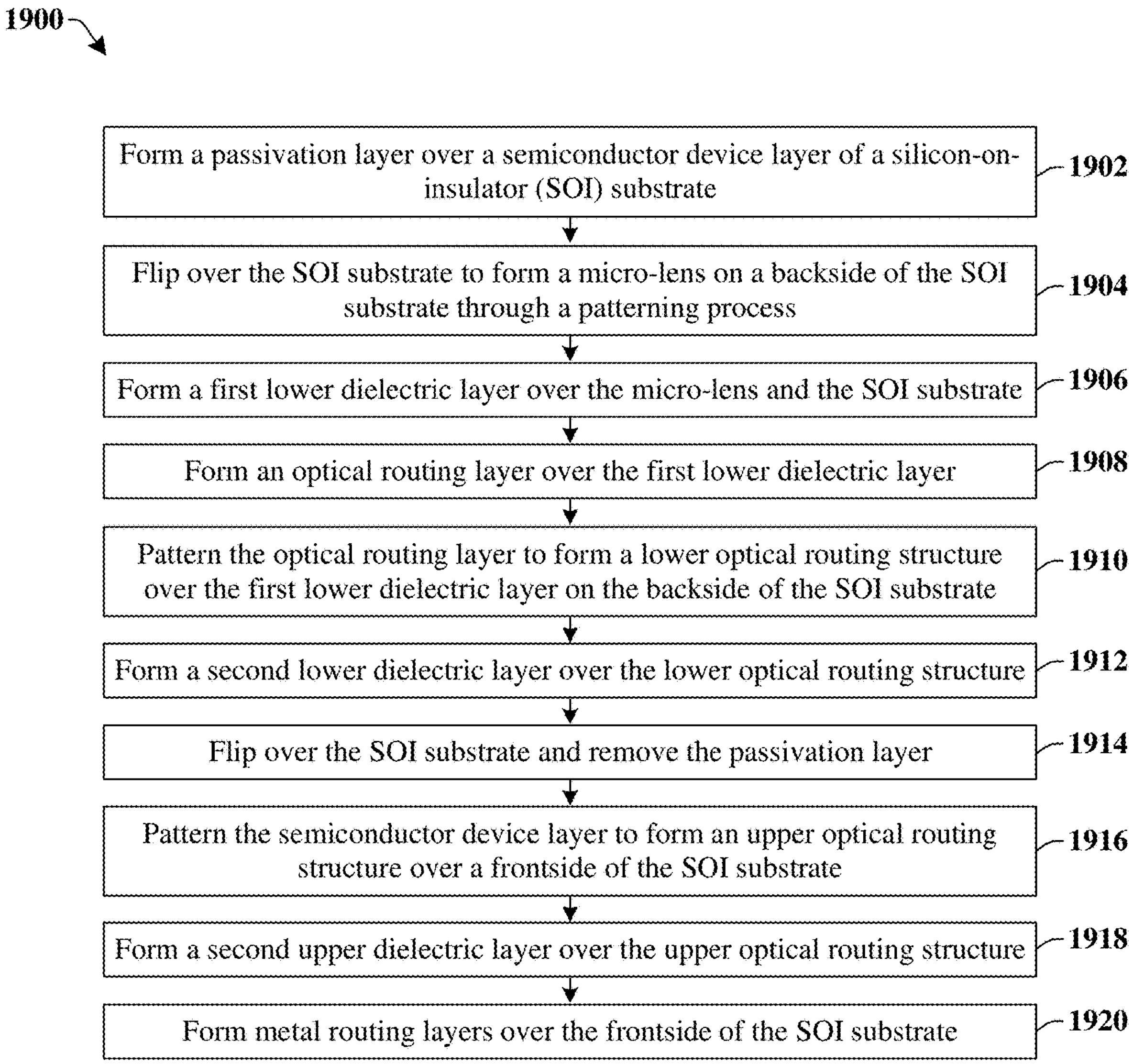
FIG. 19 illustrates a flow diagram of some embodiments corresponding to the method illustrated in FIGS. 7-18.

FIG. 19 illustrates a flow diagram of some embodiments of a method 1900 corresponding to the method illustrated in FIGS. 7-18.

While method 1900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, a passivation layer is formed over a semiconductor device layer of a silicon-on-insulator (SOI) substrate. FIG. 8 illustrates a cross-sectional view 800 of some embodiments corresponding to act 1902.

At act 1904, the SOI substrate is flipped over to form a micro-lens on a backside of the SOI substrate through a patterning process. FIG. 9 illustrates a cross-sectional view 900 of some embodiments corresponding to act 1904.

At act 1906, a first lower dielectric layer is formed over the micro-lens and the SOI substrate. FIG. 10 illustrates a cross-sectional view 1000 of some embodiments corresponding to act 1906.

At act 1908, an optical routing layer is formed over the first lower dielectric layer. FIG. 11 illustrates a cross-sectional view 1100 of some embodiments corresponding to act 1908.

At act 1910, the optical routing layer is patterned to form a lower optical routing structure over the first lower dielectric layer on the backside of the SOI substrate. FIG. 12 illustrates a cross-sectional view 1200 of some embodiments corresponding to act 1910.

At act 1912, a second lower dielectric layer is formed over the lower optical routing structure. FIG. 13 illustrates a cross-sectional view 1300 of some embodiments corresponding to act 1912.

At act 1914, the SOI substrate is flipped over and the passivation layer is removed.

At act 1916, the semiconductor device layer is patterned to form an upper optical routing structure over a frontside of the SOI substrate. FIG. 15 illustrates a cross-sectional view 1500 of some embodiments corresponding to acts 1914 and 1916.

At act 1918, a second upper dielectric layer is formed over the upper optical routing structure.

At act 1920, metal routing layers are formed over the frontside of the SOI substrate. FIG. 17 illustrates a cross-sectional view 1700 of some embodiments corresponding to acts 1918 and 1920.

FIGS. 20-25 illustrate cross-sectional views 2000-2500 of some other embodiments of a method of forming an upper optical routing structure on a frontside of a silicon-on-insulator (SOI) substrate followed by forming a lower optical routing structure on a backside of the SOI substrate. Although FIGS. 20-25 are described in relation to a method, it will be appreciated that the structures disclosed in FIGS. 20-25 are not limited to such a method, but instead may stand alone as structures independent of the method.

Figure 20:
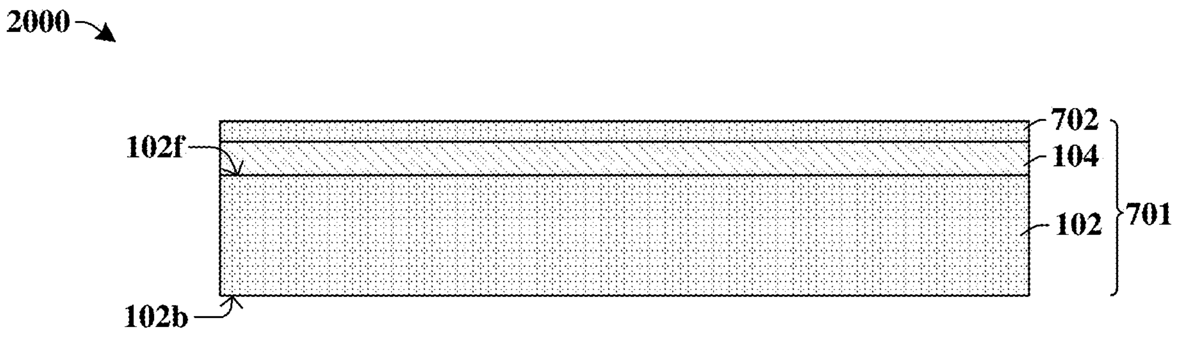
FIGS. 20-25 illustrate cross-sectional views of some embodiments of a method of forming an upper optical routing structure on a frontside of an SOI substrate followed by forming a lower optical routing structure on a backside of the SOI substrate

As shown in cross-sectional view 2000 of FIG. 20, a SOI substrate 701 is provided. The SOI substrate 701 may comprise the same or similar features as described regarding the SOI substrate 701 of FIG. 7.

Figure 21:
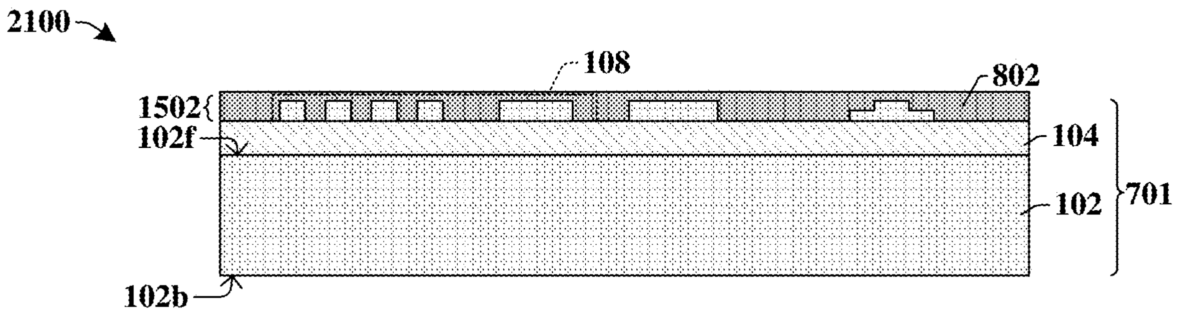

As shown in cross-sectional view 2100 of FIG. 21, in some embodiments, a patterning process is performed to remove portions of the semiconductor device layer (702 of FIG. 14) to form a patterned semiconductor device layer 1502. In some embodiments, as described with respect to the cross-sectional view 1500 of FIG. 15, the patterned semiconductor device layer 1502 may comprise at least the upper optical routing structure 108, and the patterning process used to form the patterned semiconductor device layer 1502 comprises photolithography and removal (e.g., etching) processes.

Further, in some embodiments, after the formation of the patterned semiconductor device layer 1502, the passivation layer 802 is formed over the SOI substrate 701. In some embodiments, the passivation layer 802 may comprise the same and/or similar materials and be formed using the same or similar processes as described with respect to the passivation layer 802 of FIG. 8.

Figure 22:
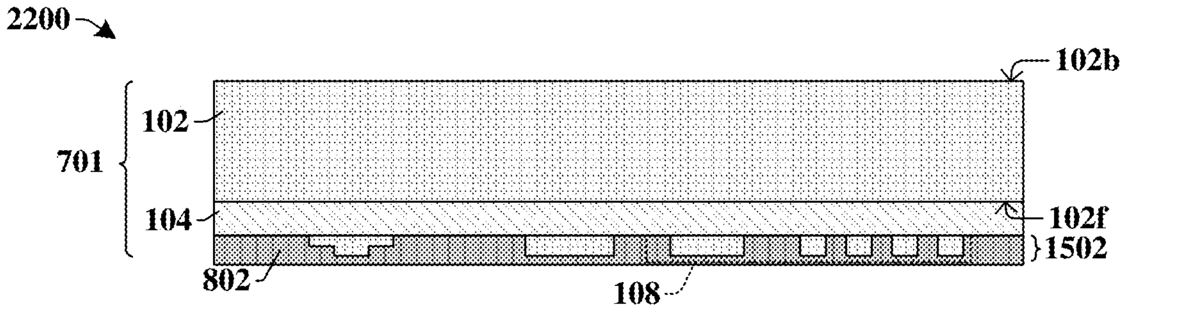

As shown in cross-sectional view 2200 of FIG. 22, in some embodiments, after the formation of the upper optical routing structure 108, the SOI substrate 701 is flipped over such that the backside 102*b* of the substrate 102 is facing "up" to be patterned.

Figure 23:
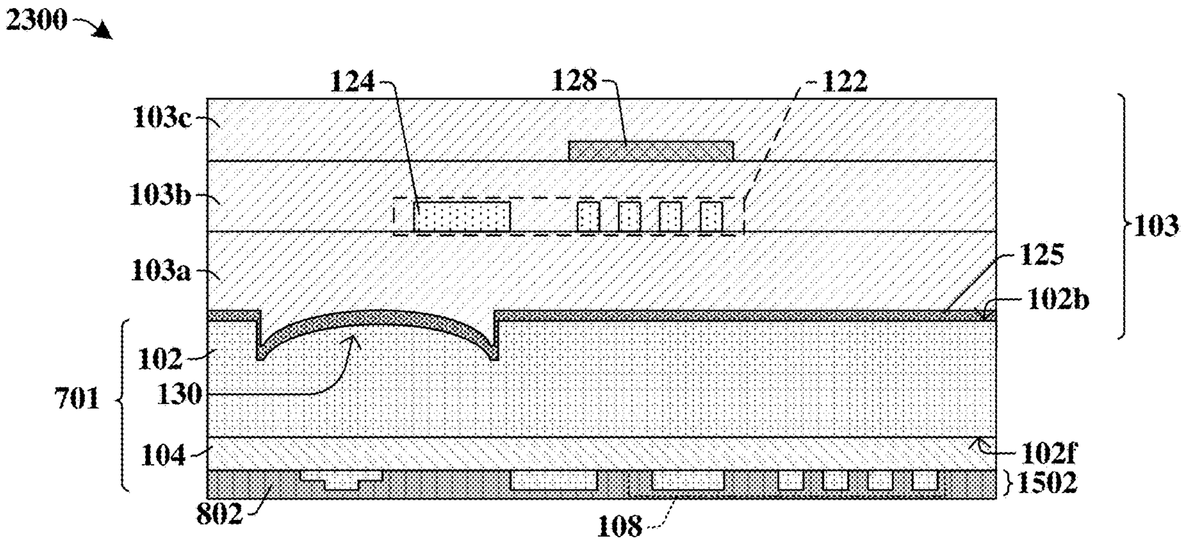

As shown in cross-sectional view 2300 of FIG. 23, a lower dielectric structure 103, a lower optical routing structure, and a lower reflective layer 128 may be formed as described in the cross-sectional views 1000-1400 of FIGS. 10-14, respectively, for example.

Figure 24:
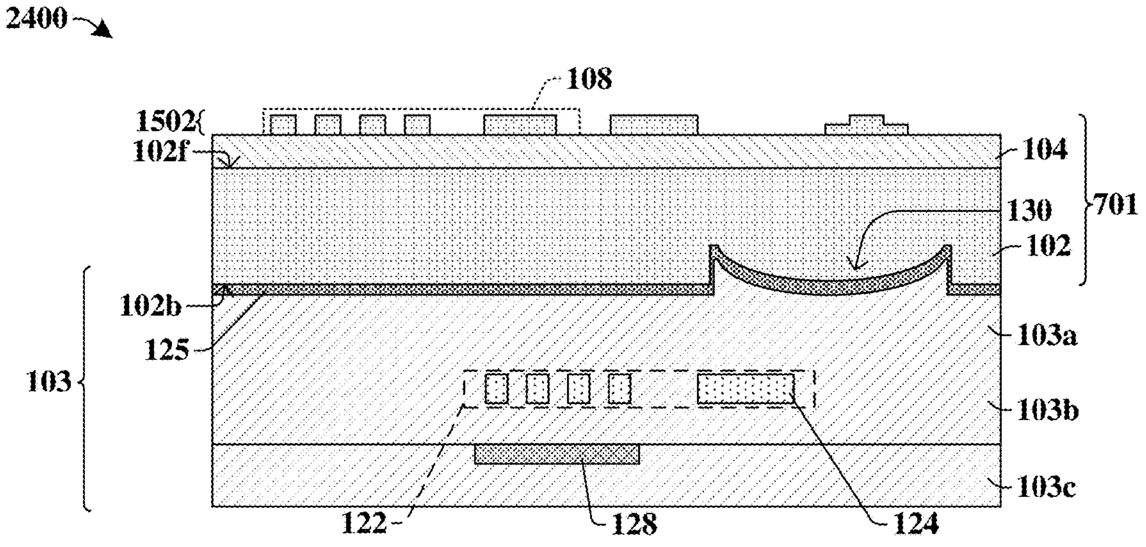

As shown in cross-sectional view 2400 of FIG. 24, the SOI substrate 701 is again flipped over, such that the frontside 102*f* of the substrate 102 is facing "up" to be patterned. In some embodiments, after flipped over the SOI substrate 701, the passivation layer (802 of FIG. 23) is removed. In some embodiments, the passivation layer (802 of FIG. 23) is removed by way of a wet etching process or a dry etching process, wherein the patterned semiconductor device layer 1502 and the first upper dielectric layer 104 are substantially resistant to removal by way of the wet or dry etching processes.

Figure 25:
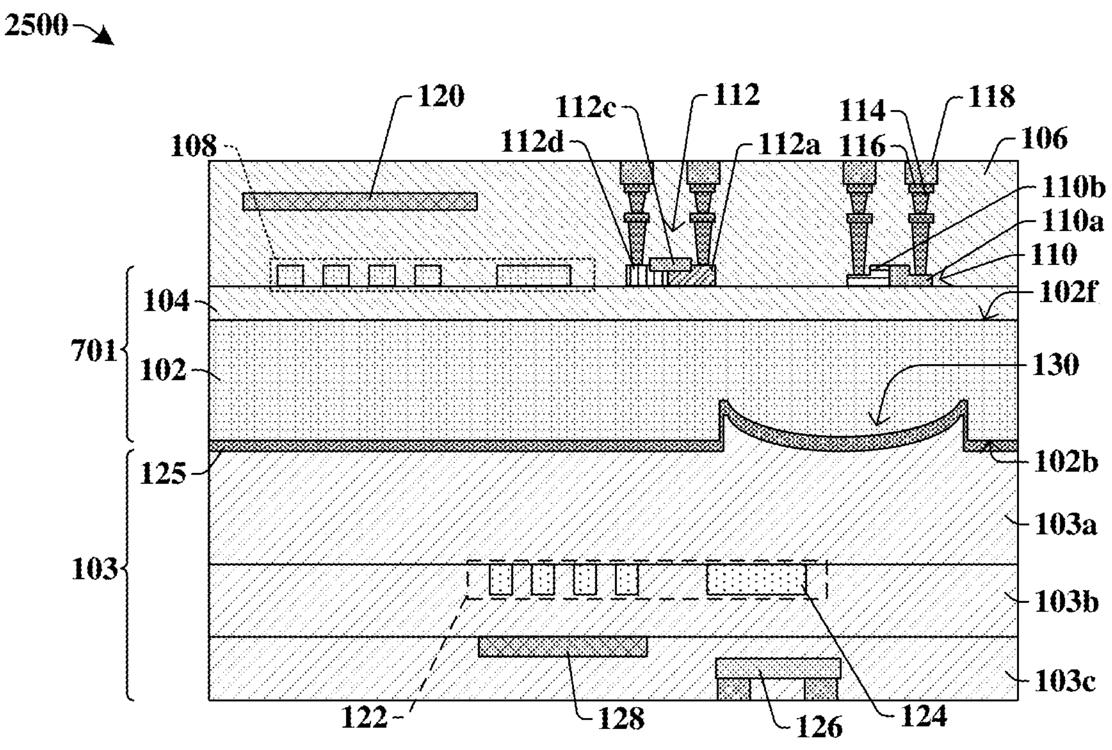

As shown in cross-sectional view 2500 of FIG. 25, in some embodiments, the photodiode 112, the waveguide 110, the interconnect wires 116, the interconnect vias 114, the contact pads 118, the second upper dielectric layer 106, and/or the heater device 126 may be formed as described in the cross-sectional views 1600-1800 of FIGS. 16-18, respectively, for example.

It will be appreciated that in the method of FIGS. 20-25, the photonic devices such as the photodiode 112 and the waveguide 110 are formed on the frontside 102*f* of the substrate 102 after the formation of the lower optical routing structure 122 formed on the backside 102*b* of the substrate 102. This way, damage to the photonic devices (e.g., the photodiode 112, the waveguide 110) is prevented during the formation of the lower optical routing structure 122 and also, device density is increased by utilized both the frontside 102*f* and the backside 102*b* of the substrate 102.

Figure 26:
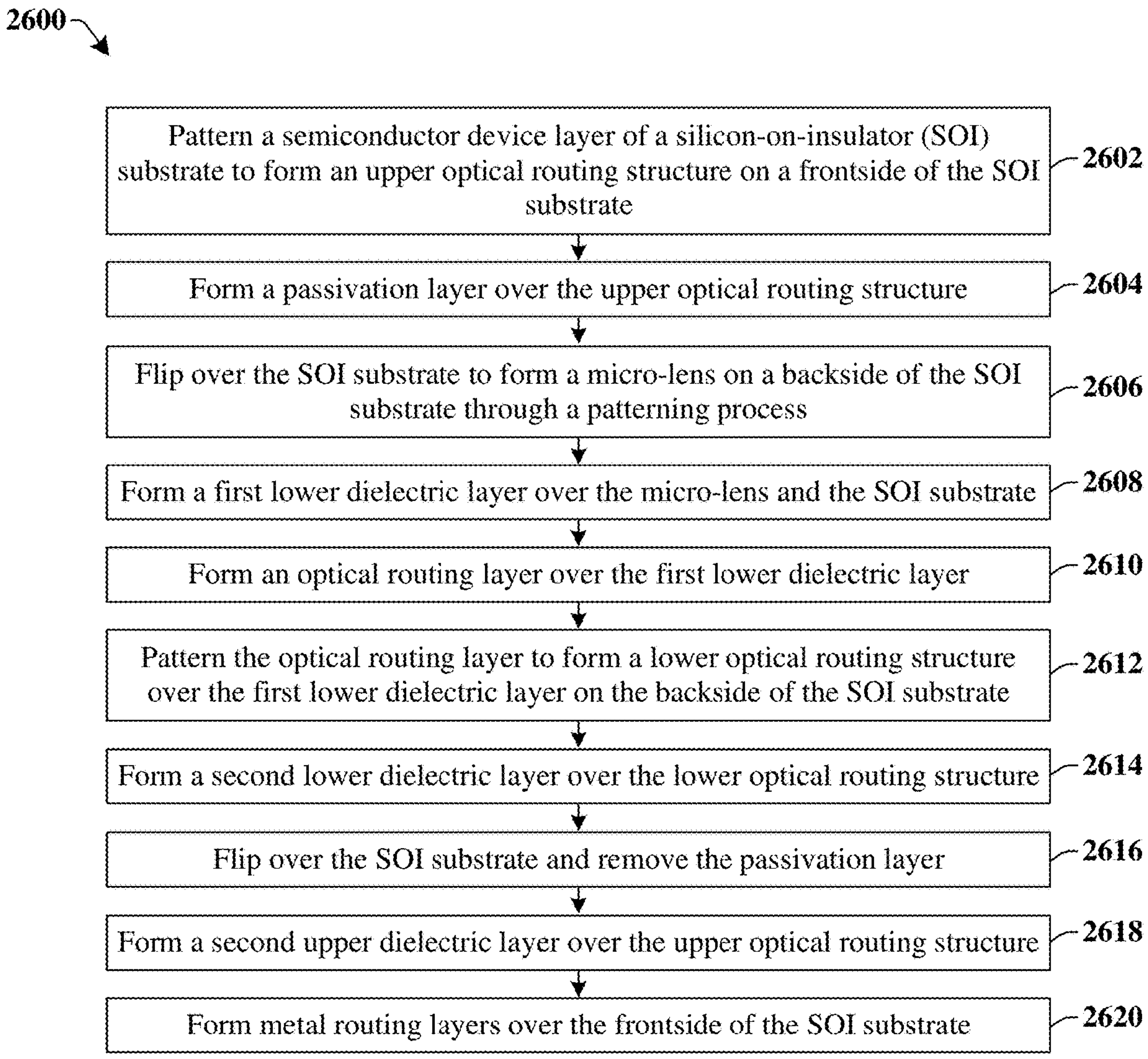
FIG. 26 illustrates a flow diagram of some embodiments corresponding to the method illustrated in FIGS. 20-25.

FIG. 26 illustrates a flow diagram of some embodiments of a method 2600 corresponding to the method illustrated in FIGS. 20-25.

While method 2600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2602, a semiconductor device layer of a SOI substrate is patterned to form an upper optical routing structure on a frontside of the SOI substrate.

At act 2604, a passivation layer is formed over the upper optical routing structure. FIG. 21 illustrates a cross-sectional view 2100 of some embodiments corresponding to acts 2602 and 2604.

At act 2606, the SOI substrate is flipped over to form a micro-lens on a backside of the SOI substrate through a patterning process. FIGS. 22 and 23 illustrate cross-sectional views 2200 and 2300, respectively, of some embodiments corresponding to act 2606.

At act 2608, a first lower dielectric layer is formed over the micro-lens and the SOI substrate.

At act 2610, an optical routing layer is formed over the first lower dielectric layer.

At act 2612, the optical routing layer is patterned to form a lower optical routing structure over the first lower dielectric layer on the backside of the SOI substrate.

At act 2614, a second lower dielectric layer is formed over the lower optical routing structure. FIG. 23 illustrates a cross-sectional view 2300 of some embodiments corresponding to acts 2608, 2610, 2612, and 2614.

At act 2616, the SOI substrate is flipped over and the passivation layer is removed. FIG. 24 illustrates a cross-sectional view 2400 of some embodiments corresponding to act 2616.

At act 2618, a second upper dielectric layer is formed over the upper optical routing structure.

At act 2620, metal routing layers are formed over the frontside of the SOI substrate. FIG. 25 illustrates a cross-sectional view 2500 of some embodiments corresponding to acts 2618 and 2620.

FIGS. 27-30 illustrate cross-sectional views 2700-3000 of yet some other embodiments of a method of forming an upper optical routing structure on a frontside of a silicon-on-insulator (SOI) substrate, forming a lower optical routing structure on a frontside of a bulk substrate, and bonding the SOI substrate to the bulk substrate. Although FIGS. 27-30 are described in relation to a method, it will be appreciated that the structures disclosed in FIGS. 27-30 are not limited to such a method, but instead may stand alone as structures independent of the method.

Figure 27:
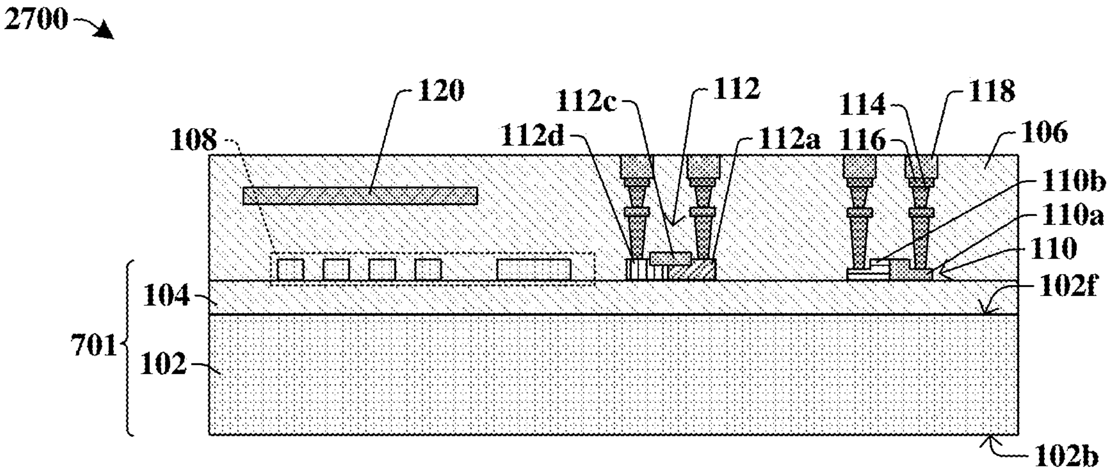
FIGS. 27-30 illustrate cross-sectional views of yet some other embodiments of a method of forming an upper optical routing structure on a frontside of a silicon-on-insulator (SOI) substrate, forming a lower optical routing structure on a frontside of a bulk substrate, and bonding the SOI substrate to the bulk substrate.

As shown in cross-sectional view 2700 of FIG. 27, in some embodiments, an upper optical routing structure 108, photonic devices (e.g., a photodiode 112, a waveguide 110), metal routing layers (e.g., interconnect vias 114, interconnect wires 116, contact pads 118), a second upper dielectric layer 106, and/or an upper reflective layer 120 are formed over a frontside 102*f* of a substrate 102 from an SOI substrate 701 as described in cross-sectional views 1500-1800 of FIGS. 15-18, respectively, for example.

Figure 28:
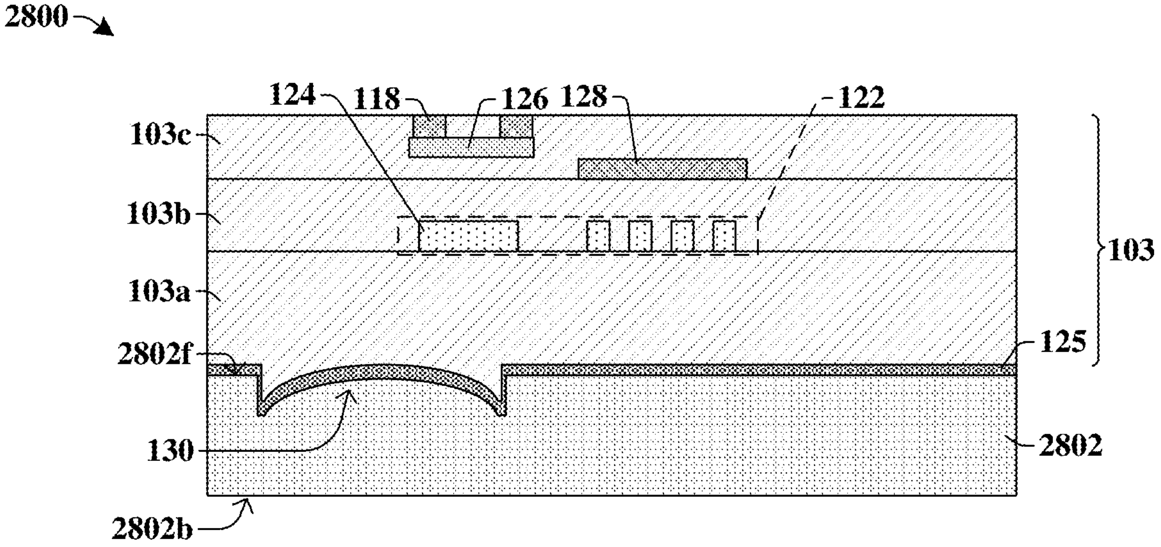

As shown in cross-sectional view 2800 of FIG. 28, in some embodiments, a micro-lens 130, an anti-reflective layer 125, a lower dielectric structure 103, a lower optical routing structure 122, a lower reflective layer 128, a heater device 126, and/or contact pads 118 are formed over a frontside 2802*f* of a bulk substrate 2802 similar to the method illustrated in cross-sectional views 900-1400 of FIGS. 9-14, respectively, for example. A backside 2802*b* of the bulk substrate 2802 may be opposite to the frontside 2802*f* of the bulk substrate 2802.

In some embodiments, the bulk substrate 2802 may be, for example, a semiconductor material that is crystalline to allow the passage of light through. Further, in some embodiments, the bulk substrate 2802 may comprise a same material as the substrate (102 of FIG. 27) of the SOI substrate (701 of FIG. 27) illustrated in FIG. 27. In some other embodiments, the bulk substrate 2802 may comprise some other substrate such as for example, a silicon-on-insulator substrate.

Nevertheless, the lower optical routing structure 122 may be formed separately and on a different substrate than the upper optical routing structure (108 of FIG. 27) and the photonic devices (e.g., photodiode 112 of FIG. 27, waveguide 110 of FIG. 27) which allows for the lower optical routing structure's 122 manufacturing processes to be optimized without the consideration of damaging the upper optical routing structure (108 of FIG. 27) and/or the photonic devices (e.g., photodiode 112 of FIG. 27, waveguide 110 of FIG. 27) on the SOI substrate (701 of FIG. 27).

Figure 29:
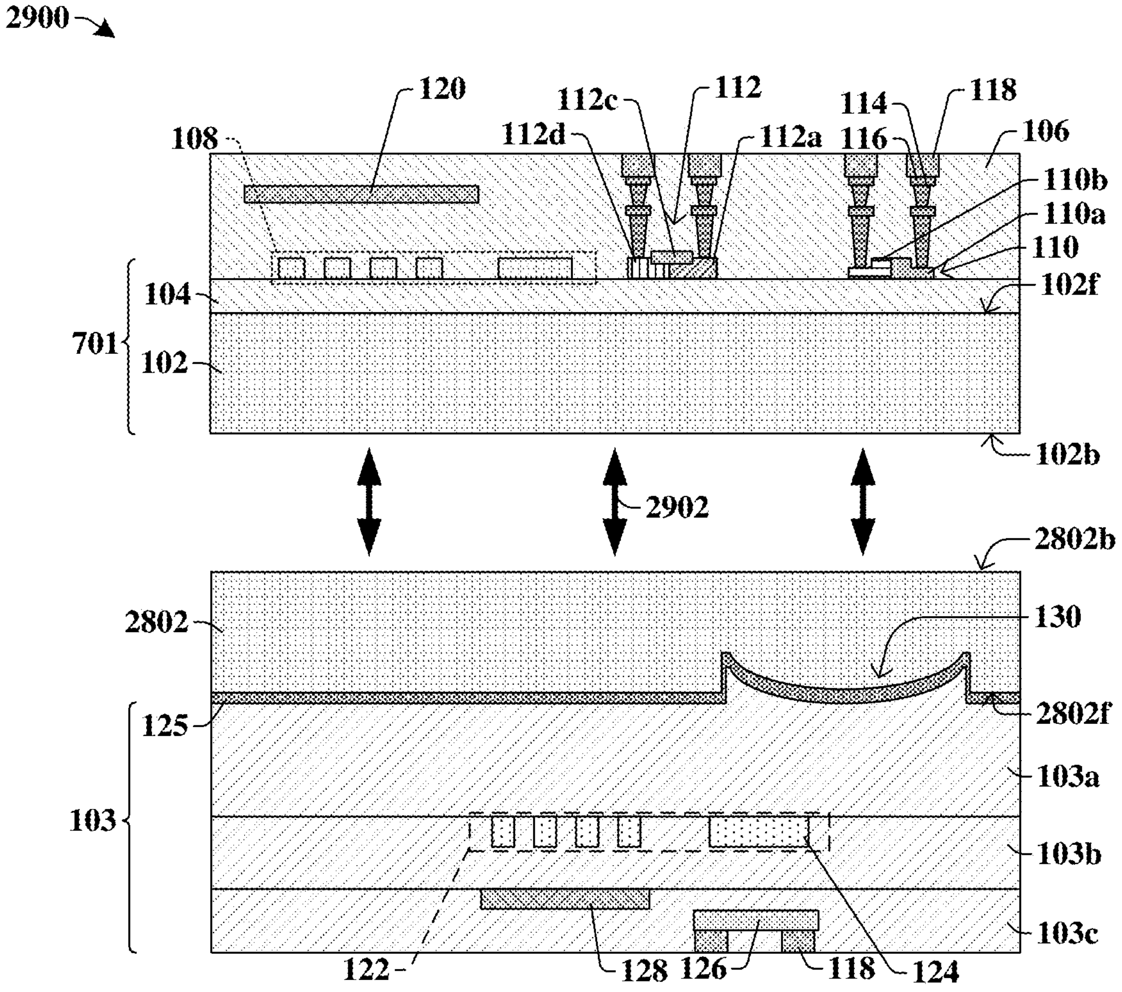

As shown in cross-sectional view 2900 of FIG. 29, in some embodiments, a bonding process 2902 is conducted to bond the backside 102*b* of the substrate 102 to the backside 2802*b* of the bulk substrate 2802. In some embodiments, the bonding process 2902 may be or comprise a hybrid bonding process utilizing heat, pressure, and/or adhesive materials.

Figure 30:
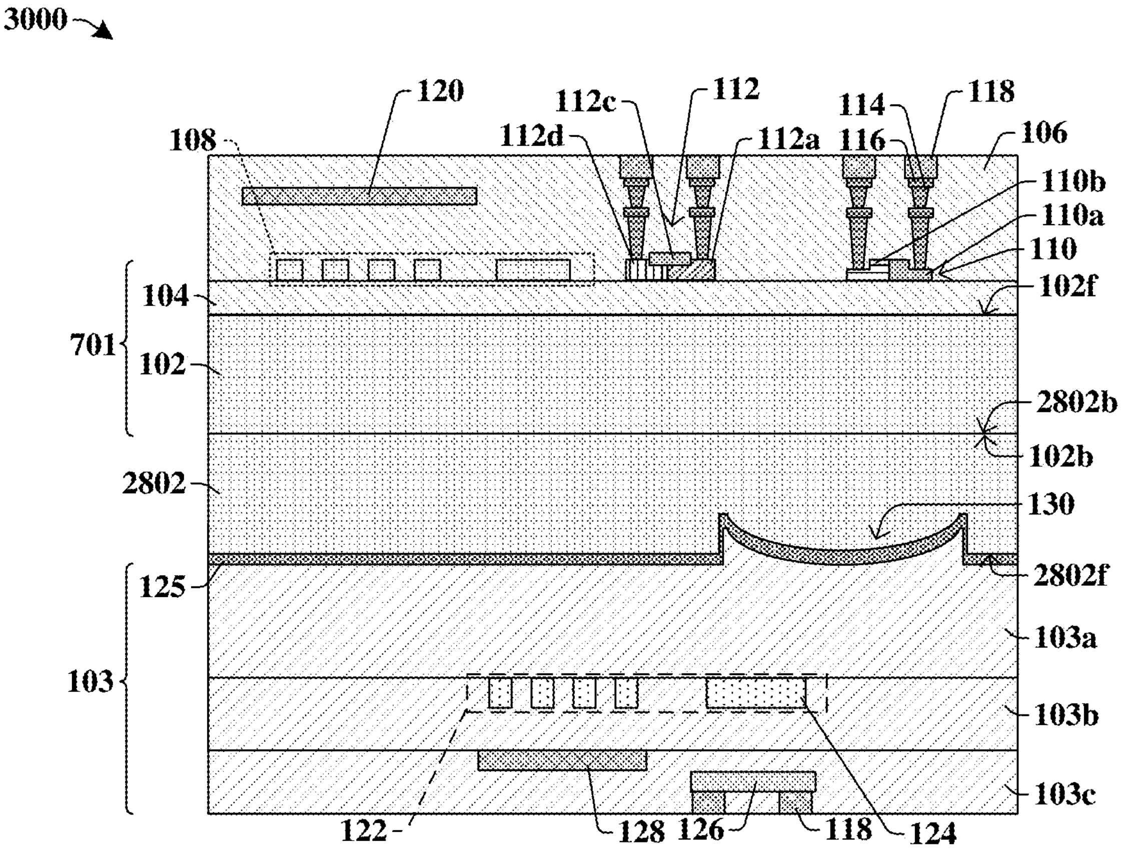

As shown in cross-sectional view 3000 of FIG. 30, the SOI substrate 701 is bonded to the bulk substrate 2802 by back-to-back bonding. In some such embodiments, one or more adhesive layers (not shown) may be present directly between the backside 2802*b* of the bulk substrate 2802 and the backside 102*b* of the substrate 102. In some such embodiments, the adhesive layers must have optical properties to allow light to travel from the frontside 2802*f* of the bulk substrate 2802 to the frontside 102*f* of the substrate 102.

Figure 31:
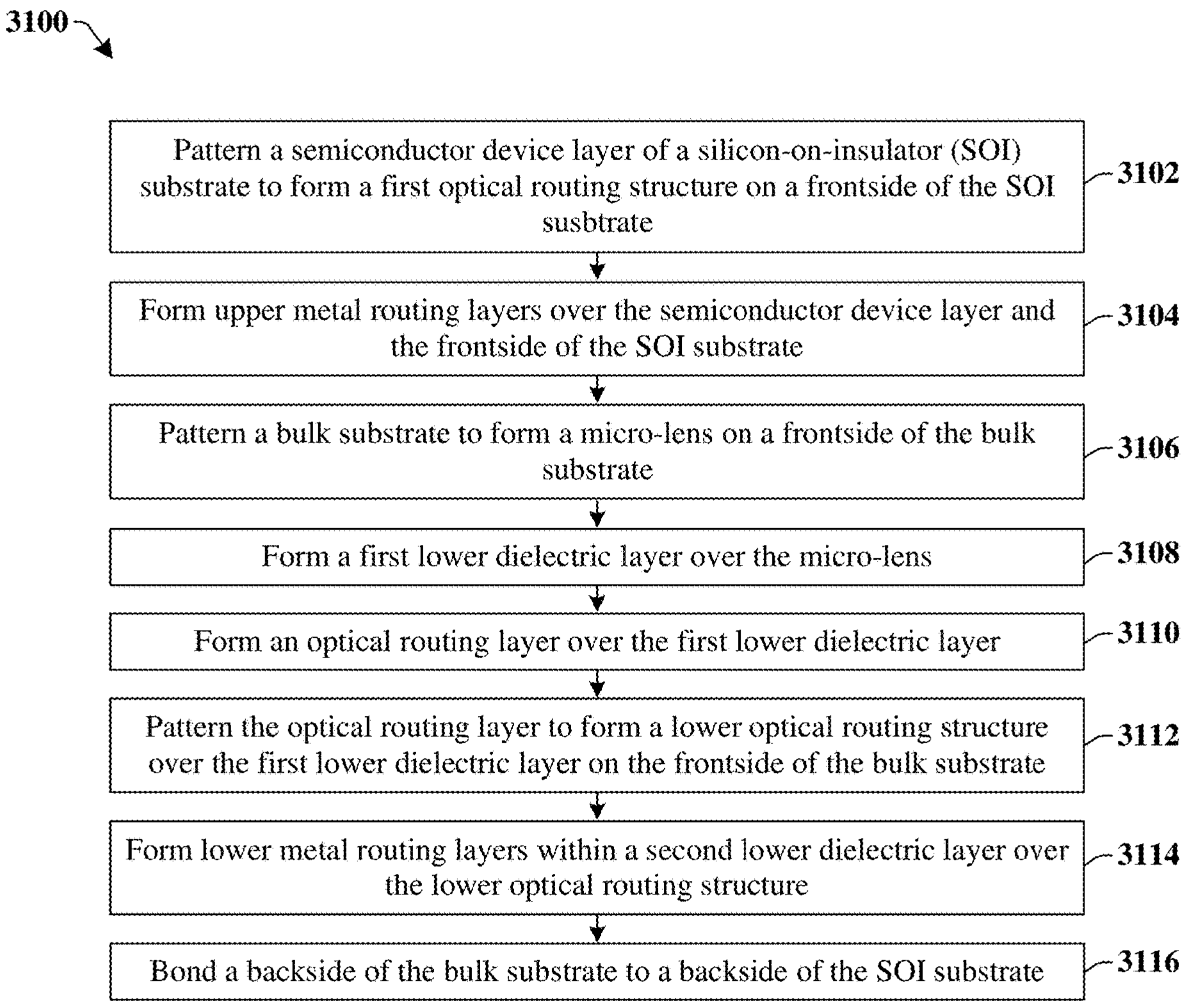
FIG. 31 illustrates a flow diagram of some embodiments corresponding to the method illustrated in FIGS. 27-30.

FIG. 31 illustrates a flow diagram of some embodiments of a method 3100 corresponding to the method illustrated in FIGS. 27-30.

While method 3100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3102, a semiconductor device layer of a SOI substrate is patterned to form an upper optical routing structure on a frontside of the SOI substrate.

At act 3104, upper metal routing layers are formed over the semiconductor device layer and the frontside of the SOI substrate. FIG. 27 illustrates a cross-sectional view 2700 of some embodiments corresponding to acts 3102 and 3104.

At act 3106, a bulk substrate is patterned to form a micro-lens on a frontside of the bulk substrate.

At act 3108, a first lower dielectric layer is formed over the micro-lens.

At act 3110, an optical routing layer is formed over the first lower dielectric layer.

At act 3112, the optical routing layer is patterned to form a lower optical routing structure over the first lower dielectric layer on the frontside of the bulk substrate.

At act 3114, lower metal routing layers are formed within a second lower dielectric layer and over the lower optical routing structure. FIG. 28 illustrates a cross-sectional view 2800 of some embodiments corresponding to acts 3106, 3108, 3110, 3112, and 3114.

At act 3116, a backside of the bulk substrate is bonded to a backside of the SOI substrate. FIGS. 29 and 30 illustrate cross-sectional views 2900 and 3000, respectively, of some embodiments corresponding to act 3116.

Therefore, the present disclosure relates to a method of manufacturing an integrated chip comprising photonic devices by forming an upper optical routing structure on a frontside of a substrate and by forming a lower optical routing structure on a backside of the substrate to increase device density and to reliably optimize optical communication in the integrated chip.

Accordingly, in some embodiments, the present disclosure relates to an integrated chip, comprising: a substrate; an insulator layer arranged over the substrate; an upper optical routing structure arranged over the insulator layer and comprising a semiconductor material; a lower optical routing structure arranged below the substrate and embedded in a lower dielectric structure; and an anti-reflective layer arranged below and directly contacting the substrate.

In other embodiments, the present disclosure relates to an integrated chip comprising: a substrate; an upper optical routing structure arranged over the substrate and embedded in an upper dielectric structure; a lower optical routing structure arranged below the substrate and embedded in a lower dielectric structure; an anti-reflective layer arranged below and directly contacting the substrate; and a micro-lens arranged between the lower optical routing structure and a topmost surface of the substrate.

In yet other embodiments, the present disclosure relates to a method of forming an integrated chip, comprising: forming a silicon-on-insulator (SOI) substrate comprising a substrate, an insulator layer over the substrate, and a semiconductor device layer over the insulator layer; patterning a backside of the SOI substrate, wherein the backside of the SOI substrate is a bottommost surface of the substrate, and wherein patterning the backside of the SOI substrate comprises: forming an anti-reflective layer directly on the substrate, forming an optical routing layer over the anti-reflective layer, patterning the optical routing layer to form a lower optical routing structure, and forming a lower dielectric structure over the lower optical routing structure; and patterning a frontside of the SOI substrate, wherein the frontside of the SOI substrate is a topmost surface of the semiconductor device layer, and wherein patterning a frontside of the SOI substrate comprises: patterning the semiconductor device layer to form an upper optical routing structure, forming an upper dielectric structure over the upper optical routing structure, and forming photonic devices within the upper dielectric structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:

a semiconductor substrate having a first side and a second side opposite the first side;

a first dielectric layer overlying the semiconductor substrate, on the first side of the semiconductor substrate;

a second dielectric layer underlying the semiconductor substrate, on the second side of the semiconductor substrate;

a photonic device arranged over and spaced from the semiconductor substrate, in the first dielectric layer;

a lower optical routing structure arranged below and spaced from the semiconductor substrate, in the second dielectric layer;

a micro-lens underlying the semiconductor substrate and elevated relative to the lower optical routing structure on the second side of the semiconductor substrate, wherein the micro-lens has an upper surface formed by the semiconductor substrate;

wherein the second dielectric layer, the semiconductor substrate and the first dielectric layer share a common width.

2. The integrated chip according to claim 1, wherein the upper surface of the micro-lens is elevated relative to a bottommost surface of the semiconductor substrate.

3. The integrated chip according to claim 1, wherein the lower optical routing structure comprises a grating structure, which underlies the micro-lens.

4. The integrated chip according to claim 1, further comprising:

a heater device disposed in the second dielectric layer and underlying the lower optical routing structure.

5. The integrated chip according to claim 1, further comprising:

an upper optical routing structure arranged over and spaced from the semiconductor substrate, in the first dielectric layer; and wherein the upper and lower optical routing structures are optically coupled together by an optical path defined in part by a semiconductor material of the semiconductor substrate.

6. The integrated chip according to claim 5, wherein the upper optical routing structure and the photonic device are level with each other.

7. The integrated chip according to claim 1, further comprising:

an anti-reflective layer underlying the semiconductor substrate and conforming to the upper surface of the micro-lens to allow light to pass between the lower optical routing structure and the photonic device.

8. An integrated chip, comprising:

a semiconductor substrate having a first side and a second side opposite the first side;

a first dielectric layer overlying the semiconductor substrate, on the first side of the semiconductor substrate;

a second dielectric layer underlying the semiconductor substrate, on the second side of the semiconductor substrate;

a first optical routing structure overlying and spaced from the semiconductor substrate, in the first dielectric layer, the first optical routing structure including a semiconductive device configured to modulate an optical signal;

a second optical routing structure underlying and spaced from the semiconductor substrate, in the second dielectric layer, the second optical routing structure including a passive dielectric element configured to guide the optical signal;

a first reflector overlying the first optical routing structure and extending parallel to the first optical routing structure, in the first dielectric layer; and a second reflector underlying the second optical routing structure and extending parallel to the second optical routing structure, in the second dielectric layer, wherein the second dielectric layer, the semiconductor substrate, and the first dielectric layer are stacked to form a monolithic structure within the integrated chip.

9. The integrated chip according to claim 8, wherein the first and second optical routing structures are optically coupled together by a portion of the semiconductor substrate.

10. The integrated chip according to claim 8, wherein the first and second optical routing structures respectively comprise a first grating structure disposed in the first dielectric layer and a second grating structure disposed in the second dielectric layer, wherein the first reflector overlies the first grating structure, and wherein the second reflector underlies the second grating structure.

11. The integrated chip according to claim 10, wherein the first and second grating structures are directly between the first and second reflectors.

12. The integrated chip according to claim 8, further comprising:

a stack of wires and vias overlying the semiconductor substrate.

13. The integrated chip according to claim 12, further comprising:

a photonic device overlying and spaced from the semiconductor substrate, wherein the stack of wires and vias overlies and is electrically coupled to the photonic device, and wherein the first optical routing structure is level with the photonic device.

14. The integrated chip according to claim 8, wherein the first optical routing structure includes a semiconductive modulator, and wherein the second optical routing structure is a dielectric waveguide.

15. An integrated chip, comprising:

a semiconductor substrate having a first side and a second side opposite the first side;

a first dielectric layer overlying the semiconductor substrate, on the first side of the semiconductor substrate:

a second dielectric layer underlying the semiconductor substrate, on the second side of the semiconductor substrate;

a photonic device overlying and spaced from the semiconductor substrate, in the first dielectric layer, the photonic device including a photodiode configured to detect an optical signal;

a semiconductor optical routing structure overlying and spaced from the semiconductor substrate, in the first dielectric layer, the semiconductor optical routing structure including first and second doped regions configured to modulate the optical signal, wherein the semiconductor optical routing structure and the photonic device are disposed on a common substrate surface, in the first dielectric layer; and a dielectric optical routing structure underlying and spaced from the semiconductor substrate, in the second dielectric layer and optically coupled to the semiconductor optical routing structure through the semiconductor substrate, wherein the second dielectric layer, the semiconductor substrate, and the first dielectric layer share a common lateral extent in a first dimension.

16. The integrated chip according to claim 15, wherein the semiconductor substrate has a curved surface that separates the dielectric optical routing structure from the semiconductor optical routing structure.

17. The integrated chip according to claim 15, wherein the semiconductor optical routing structure comprises silicon and the dielectric optical routing structure comprises silicon nitride.

18. The integrated chip according to claim 15, further comprising:

a heater underlying and spaced from the dielectric optical routing structure, in the second dielectric layer.

19. The integrated chip according to claim 15, further comprising:

a third dielectric layer between and contacting the semiconductor substrate and the photonic device and between and contacting the semiconductor substrate and the semiconductor optical routing structure.

20. The integrated chip according to claim 15, further comprising:

an anti-reflective layer between the semiconductor substrate and the dielectric optical routing structure.

* * * * *